US011569258B2

(12) United States Patent
Liu et al.

(10) Patent No.: US 11,569,258 B2
(45) Date of Patent: Jan. 31, 2023

(54) INTEGRATED ASSEMBLIES WHICH INCLUDE STACKED MEMORY DECKS, AND METHODS OF FORMING INTEGRATED ASSEMBLIES

(71) Applicant: Micron Technology, Inc., Boise, ID (US)

(72) Inventors: Liu Liu, Dalian (CN); David Daycock, Boise, ID (US); Rithu K. Bhonsle, Boise, ID (US); Giovanni Mazzone, Boise, ID (US); Narula Bilik, Boise, ID (US); Jordan D. Greenlee, Boise, ID (US); Minsoo Lee, Boise, ID (US); Benben Li, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 368 days.

(21) Appl. No.: 16/933,693

(22) Filed: Jul. 20, 2020

(65) Prior Publication Data
US 2020/0350333 A1 Nov. 5, 2020

Related U.S. Application Data

(62) Division of application No. 16/171,160, filed on Oct. 25, 2018, now Pat. No. 10,748,921.

(51) Int. Cl.
*H01L 27/11578* (2017.01)
*H01L 27/11582* (2017.01)
*H01L 27/11524* (2017.01)
*H01L 21/32* (2006.01)
*H01L 27/1157* (2017.01)
(Continued)

(52) U.S. Cl.
CPC ... *H01L 27/11582* (2013.01); *H01L 21/31111* (2013.01); *H01L 21/32* (2013.01); *H01L 27/1157* (2013.01); *H01L 27/11524* (2013.01); *H01L 27/11556* (2013.01)

(58) Field of Classification Search
CPC combination set(s) only.
See application file for complete search history.

(56) References Cited

U.S. PATENT DOCUMENTS 9,362,300 B2   6/2016  Lu et al.
9,431,410 B2   8/2016  Sun et al.
9,502,471 B1   11/2016 Lu et al.
(Continued)

*Primary Examiner* — Suberr L Chi
(74) *Attorney, Agent, or Firm* — Wells St. John P.S.

(57) ABSTRACT

Some embodiments include a method of forming stacked memory decks. A first deck has first memory cells arranged in first tiers disposed one atop another, and has a first channel-material pillar extending through the first tiers. An inter-deck structure is over the first deck. The inter-deck structure includes an insulative expanse, and a region extending through the insulative expanse and directly over the first channel-material pillar. The region includes an etch-stop structure. A second deck is formed over the inter-deck structure. The second deck has second memory cells arranged in second tiers disposed one atop another. An opening is formed to extend through the second tiers and to the etch-stop structure. The opening is subsequently extended through the etch-stop structure. A second channel-material pillar is formed within the opening and is coupled to the first channel-material pillar. Some embodiments include integrated assemblies.

12 Claims, 26 Drawing Sheets

(51) Int. Cl.
*H01L 21/311* (2006.01)
*H01L 27/11556* (2017.01)

(56) References Cited

U.S. PATENT DOCUMENTS

| | | |
|---|---|---|
| 9,595,531 B2 | 3/2017 | Zhu et al. |
| 9,748,265 B1 | 8/2017 | Lee |
| 9,853,046 B2 | 12/2017 | Lu et al. |
| 9,881,929 B1 * | 1/2018 | Ravikirthi ........... H01L 27/1157 |
| 2011/0151667 A1 | 6/2011 | Hwang |
| 2012/0003800 A1 | 1/2012 | Lee et al. |
| 2014/0264525 A1 | 9/2014 | Takahashi et al. |
| 2014/0273373 A1 | 9/2014 | Makala et al. |
| 2015/0118811 A1 | 4/2015 | Makala et al. |
| 2015/0279855 A1 | 10/2015 | Lu et al. |
| 2016/0133640 A1 | 5/2016 | Zhu et al. |
| 2016/0247756 A1 | 8/2016 | Li et al. |
| 2018/0019255 A1 | 1/2018 | Hopkins et al. |
| 2019/0067320 A1 * | 2/2019 | Cho .................. H01L 27/11575 |

* cited by examiner

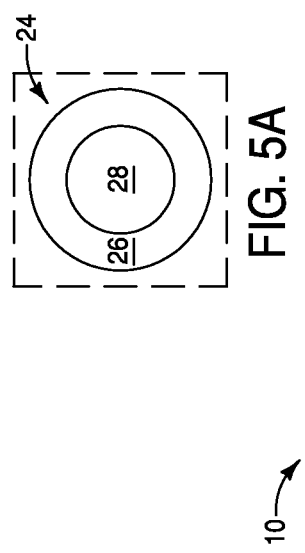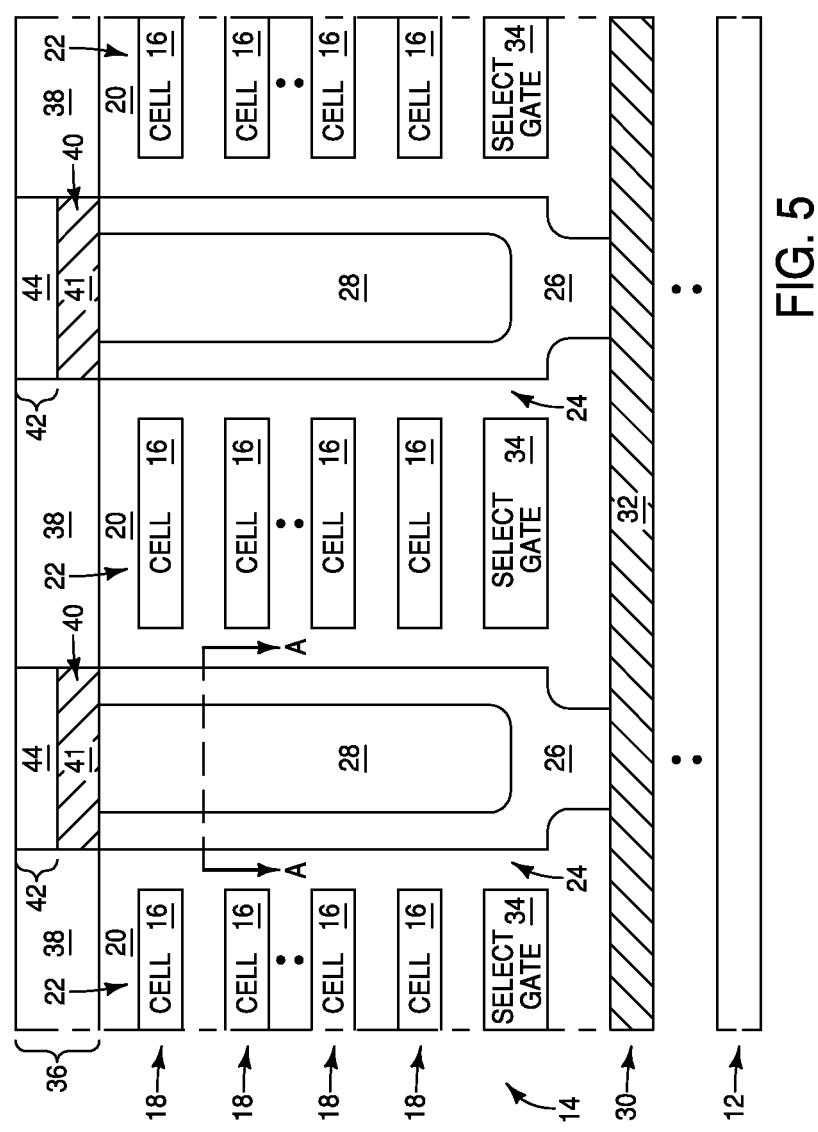

INTEGRATED ASSEMBLIES WHICH INCLUDE STACKED MEMORY DECKS, AND METHODS OF FORMING INTEGRATED ASSEMBLIES

RELATED PATENT DATA

This patent resulted from divisional application of U.S. patent application Ser. No. 16/171,160, filed Oct. 25, 2018, the disclosures of which are incorporated herein by reference.

TECHNICAL FIELD

Integrated assemblies which include stacked memory decks, and methods of forming integrated assemblies.

BACKGROUND

Memory provides data storage for electronic systems. Flash memory is one type of memory, and has numerous uses in modern computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

NAND may be a basic architecture of flash memory, and may be configured to comprise vertically-stacked memory cells.

Before describing NAND specifically, it may be helpful to more generally describe the relationship of a memory array within an integrated arrangement. FIG. 1 shows a block diagram of a prior art device 1000 which includes a memory array 1002 having a plurality of memory cells 1003 arranged in rows and columns along with access lines 1004 (e.g., wordlines to conduct signals WL0 through WLm) and first data lines 1006 (e.g., bitlines to conduct signals BL0 through BLn). Access lines 1004 and first data lines 1006 may be used to transfer information to and from the memory cells 1003. A row decoder 1007 and a column decoder 1008 decode address signals A0 through AX on address lines 1009 to determine which ones of the memory cells 1003 are to be accessed. A sense amplifier circuit 1015 operates to determine the values of information read from the memory cells 1003. An I/O circuit 1017 transfers values of information between the memory array 1002 and input/output (I/O) lines 1005. Signals DQ0 through DQN on the I/O lines 1005 can represent values of information read from or to be written into the memory cells 1003. Other devices can communicate with the device 1000 through the I/O lines 1005, the address lines 1009, or the control lines 1020. A memory control unit 1018 is used to control memory operations which are to be performed on the memory cells 1003, and utilizes signals on the control lines 1020. The device 1000 can receive supply voltage signals Vcc and Vss on a first supply line 1030 and a second supply line 1032, respectively. The device 1000 includes a select circuit 1040 and an input/output (I/O) circuit 1017. The select circuit 1040 can respond, via the I/O circuit 1017, to signals CSEL1 through CSELn to select signals on the first data lines 1006 and the second data lines 1013 that can represent the values of information to be read from or to be programmed into the memory cells 1003. The column decoder 1008 can selectively activate the CSEL1 through CSELn signals based on the A0 through AX address signals on the address lines 1009. The select circuit 1040 can select the signals on the first data lines 1006 and the second data lines 1013 to provide communication between the memory array 1002 and the I/O circuit 1017 during read and programming operations.

The memory array 1002 of FIG. 1 may be a NAND memory array, and FIG. 2 shows a block diagram of a three-dimensional NAND memory device 200 which may be utilized for the memory array 1002 of FIG. 1. The device 200 comprises a plurality of strings of charge-storage devices. In a first direction (Z-Z'), each string of charge-storage devices may comprise, for example, thirty-two charge-storage devices stacked over one another with each charge-storage device corresponding to one of, for example, thirty-two tiers (e.g., Tier0-Tier31). The charge-storage devices of a respective string may share a common channel region, such as one formed in a respective pillar of semiconductor material (e.g., polysilicon) about which the string of charge-storage devices is formed. In a second direction (X-X'), each first group of, for example, sixteen first groups of the plurality of strings may comprise, for example, eight strings sharing a plurality (e.g., thirty-two) of access lines (i.e., "global control gate (CG) lines", also known as wordlines, WLs). Each of the access lines may couple the charge-storage devices within a tier. The charge-storage devices coupled by the same access line (and thus corresponding to the same tier) may be logically grouped into, for example, two pages, such as P0/P32, P1/P33, P2/P34 and so on, when each charge-storage device comprises a cell capable of storing two bits of information. In a third direction (Y-Y'), each second group of, for example, eight second groups of the plurality of strings, may comprise sixteen strings coupled by a corresponding one of eight data lines. The size of a memory block may comprise 1,024 pages and total about 16 MB (e.g., 16 WLs×32 tiers×2 bits=1,024 pages/block, block size=1,024 pages×16 KB/page=16 MB). The number of the strings, tiers, access lines, data lines, first groups, second groups and/or pages may be greater or smaller than those shown in FIG. 2.

FIG. 3 shows a cross-sectional view of a memory block 300 of the 3D NAND memory device 200 of FIG. 2 in an X-X' direction, including fifteen strings of charge-storage devices in one of the sixteen first groups of strings described with respect to FIG. 2. The plurality of strings of the memory block 300 may be grouped into a plurality of subsets 310, 320, 330 (e.g., tile columns), such as tile column$_I$, tile column$_j$ and tile column$_K$, with each subset (e.g., tile column) comprising a "partial block" of the memory block 300. A global drain-side select gate (SGD) line 340 may be coupled to the SGDs of the plurality of strings. For example, the global SGD line 340 may be coupled to a plurality (e.g., three) of sub-SGD lines 342, 344, 346 with each sub-SGD line corresponding to a respective subset (e.g., tile column), via a corresponding one of a plurality (e.g., three) of sub-SGD drivers 332, 334, 336. Each of the sub-SGD drivers 332, 334, 336 may concurrently couple or cut off the SGDs of the strings of a corresponding partial block (e.g., tile column) independently of those of other partial blocks. A global source-side select gate (SGS) line 360 may be coupled to the SGSs of the plurality of strings. For example, the global SGS line 360 may be coupled to a plurality of sub-SGS lines 362, 364, 366 with each sub-SGS line corresponding to the respective subset (e.g., tile column), via a corresponding one of a plurality of sub-SGS drivers 322, 324, 326. Each of the sub-SGS drivers 322, 324, 326 may concurrently couple or cut off the SGSs of the strings of a corresponding partial block (e.g., tile column) independently of those of other partial blocks. A global access line (e.g., a global CG line) 350 may couple the charge-storage devices corresponding to the respective tier of each of the plurality of strings. Each global CG line (e.g., the global CG line 350) may be coupled to a plurality of sub-access lines (e.g., sub-CG lines) 352, 354, 356 via a corresponding one of a plurality of sub-string drivers 312, 314 and 316. Each of the sub-string drivers may concurrently couple or cut off the charge-storage devices corresponding to the respective partial block and/or tier independently of those of other partial blocks and/or other tiers. The charge-storage devices corresponding to the respective subset (e.g., partial block) and the respective tier may comprise a "partial tier" (e.g., a single "tile") of charge-storage devices. The strings corresponding to the respective subset (e.g., partial block) may be coupled to a corresponding one of sub-sources 372, 374 and 376 (e.g., "tile source") with each sub-source being coupled to a respective power source.

The NAND memory device 200 is alternatively described with reference to a schematic illustration of FIG. 4.

The memory array 200 includes wordlines $202_1$ to $202_N$, and bitlines $228_1$ to $228_M$.

The memory array 200 also includes NAND strings $206_1$ to $206_M$. Each NAND string includes charge-storage transistors $208_1$ to $208_N$. The charge-storage transistors may use floating gate material (e.g., polysilicon) to store charge, or may use charge-trapping material (such as, for example, silicon nitride, metallic nanodots, etc.) to store charge.

The charge-storage transistors 208 are located at intersections of wordlines 202 and strings 206. The charge-storage transistors 208 represent non-volatile memory cells for storage of data. The charge-storage transistors 208 of each NAND string 206 are connected in series source-to-drain between a source-select device (e.g., source-side select gate, SGS) 210 and a drain-select device (e.g., drain-side select gate, SGD) 212. Each source-select device 210 is located at an intersection of a string 206 and a source-select line 214, while each drain-select device 212 is located at an intersection of a string 206 and a drain-select line 215. The select devices 210 and 212 may be any suitable access devices, and are generically illustrated with boxes in FIG. 1.

A source of each source-select device 210 is connected to a common source line 216. The drain of each source-select device 210 is connected to the source of the first charge-storage transistor 208 of the corresponding NAND string 206. For example, the drain of source-select device 2101 is connected to the source of charge-storage transistor $208_1$ of the corresponding NAND string $206_1$. The source-select devices 210 are connected to source-select line 214.

The drain of each drain-select device 212 is connected to a bitline (i.e., digit line) 228 at a drain contact. For example, the drain of drain-select device $212_1$ is connected to the bitline $228_1$. The source of each drain-select device 212 is connected to the drain of the last charge-storage transistor 208 of the corresponding NAND string 206. For example, the source of drain-select device $212_1$ is connected to the drain of charge-storage transistor $208_N$ of the corresponding NAND string $206_1$.

The charge-storage transistors 208 include a source 230, a drain 232, a charge-storage region 234, and a control gate 236. The charge-storage transistors 208 have their control gates 236 coupled to a wordline 202. A column of the charge-storage transistors 208 are those transistors within a NAND string 206 coupled to a given bitline 228. A row of the charge-storage transistors 208 are those transistors commonly coupled to a given wordline 202.

Memory may be fabricated in decks, and two or more decks may be stacked one atop another. Channel regions of each of the decks may comprise channel-material pillars, and it may be desired to couple channel-material pillars of the stacked decks. It would be desirable to develop improved methods of fabricating stacked memory decks, and specifically to develop improved methods of coupling channel-material pillars of stacked memory decks.

BRIEF DESCRIPTION OF THE DRAWINGS

FIGS. 5-9 are diagrammatic cross-sectional side views of a region of an integrated assembly at example process stages of an example method for forming an example structure. FIG. 5A is a top-down view along the line A-A of FIG. 5.

DETAILED DESCRIPTION OF THE ILLUSTRATED EMBODIMENTS

Figure 1:
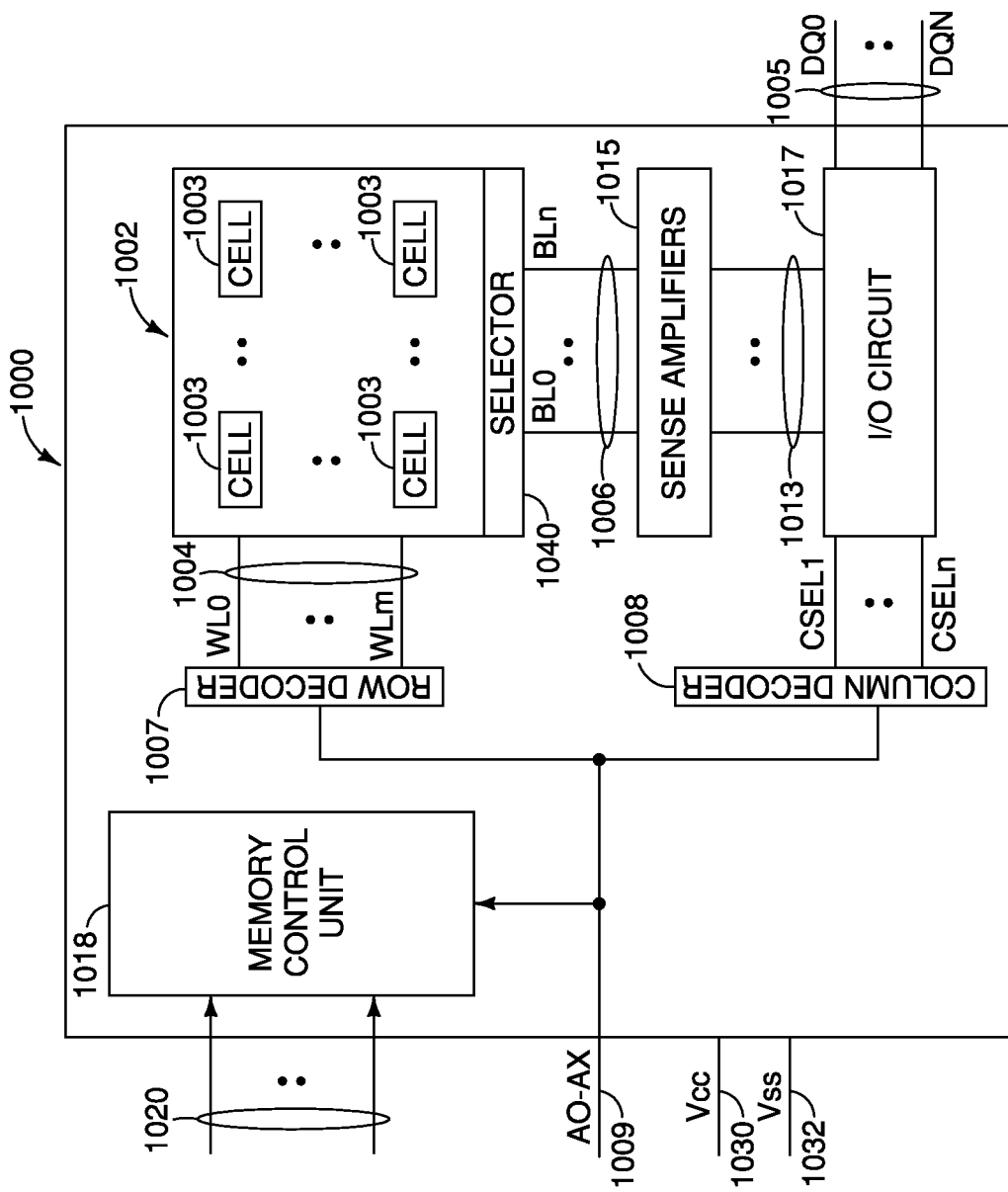
FIG. 1 shows a block diagram of a prior art memory device having a memory array with memory cells.
Figure 2:
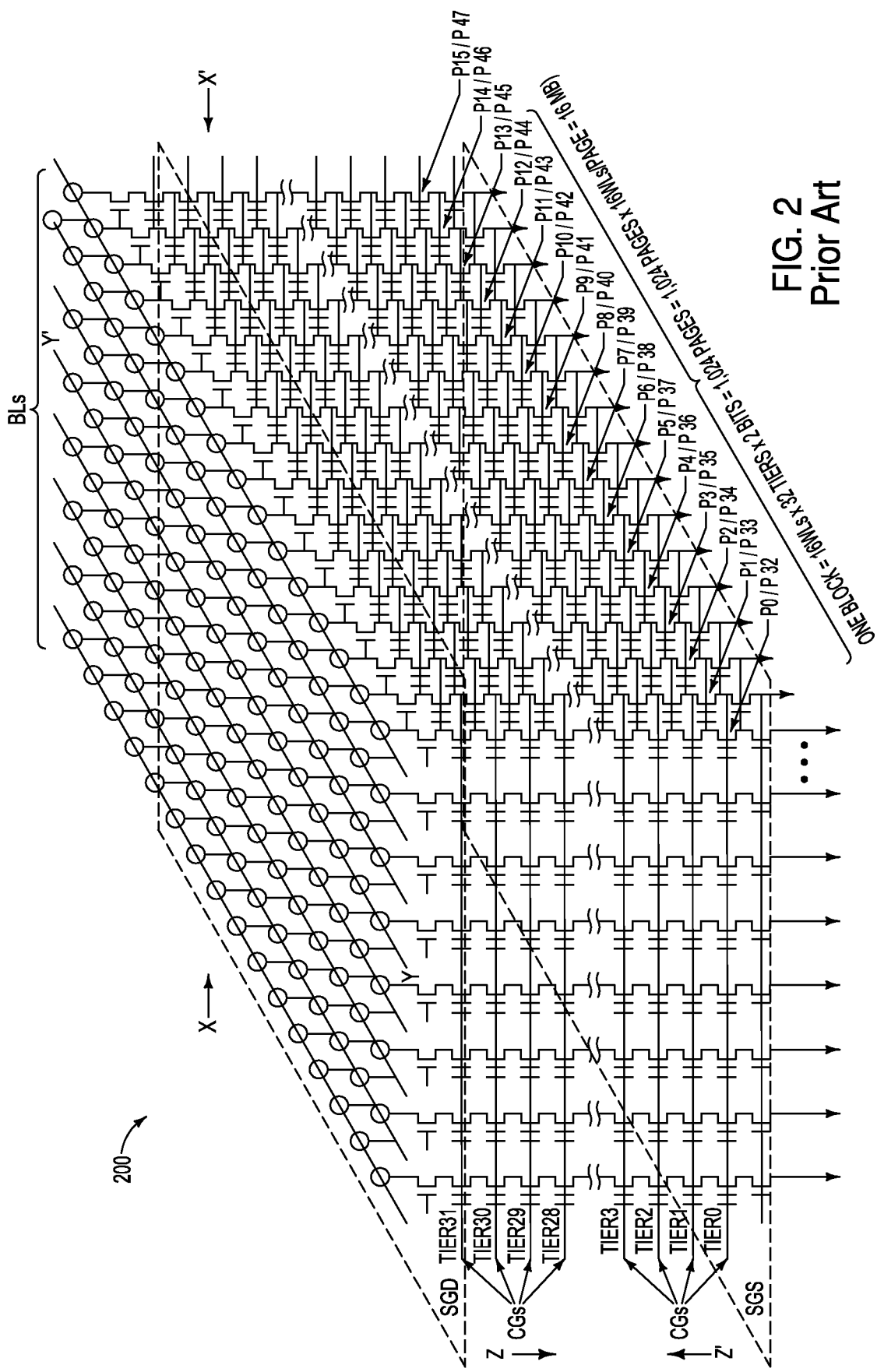
FIG. 2 shows a schematic diagram of the prior art memory array of FIG. 1 in the form of a 3D NAND memory device.
Figure 3:
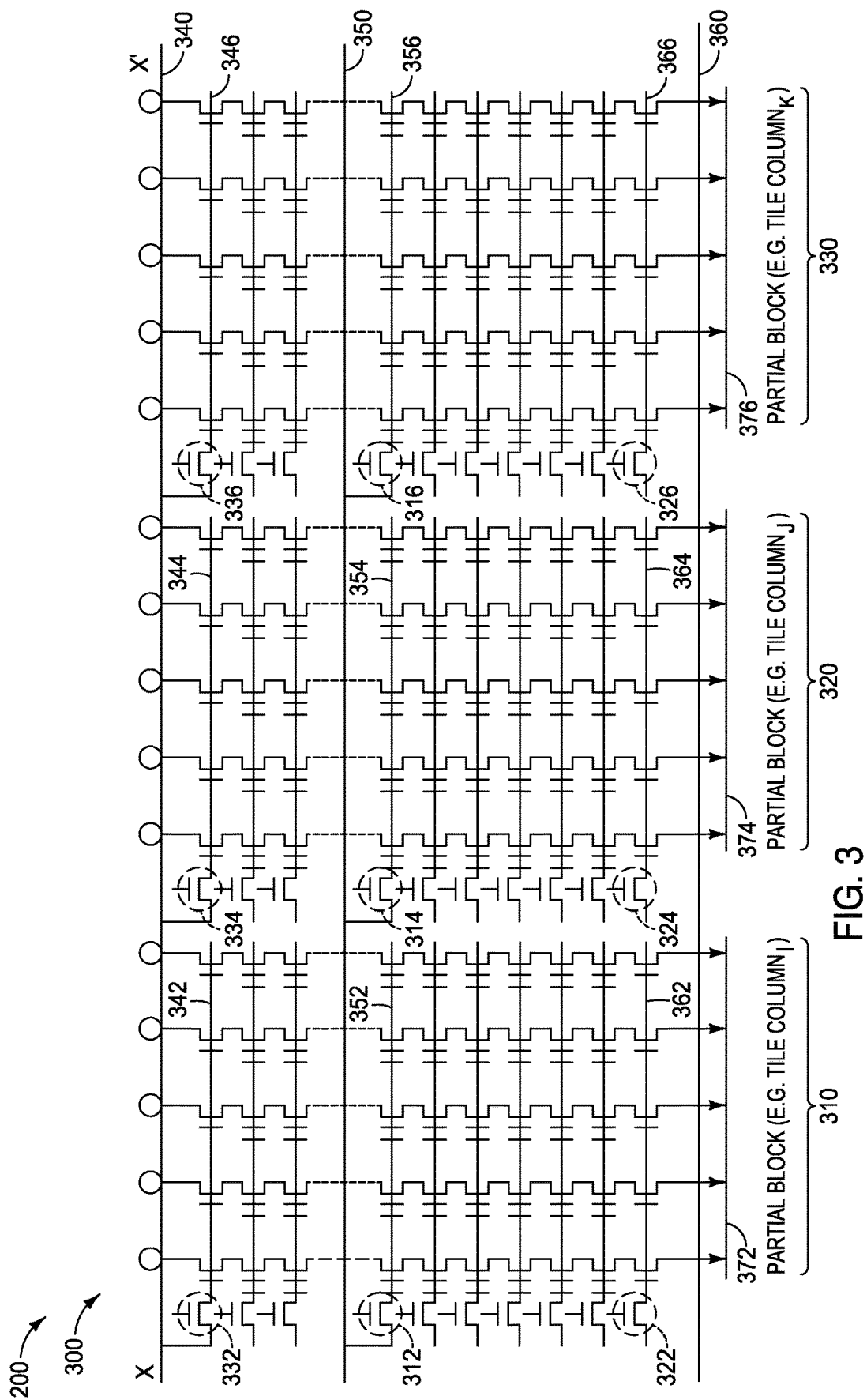
FIG. 3 shows a cross sectional view of the prior art 3D NAND memory device of FIG. 2 in an X-X' direction.
Figure 4:
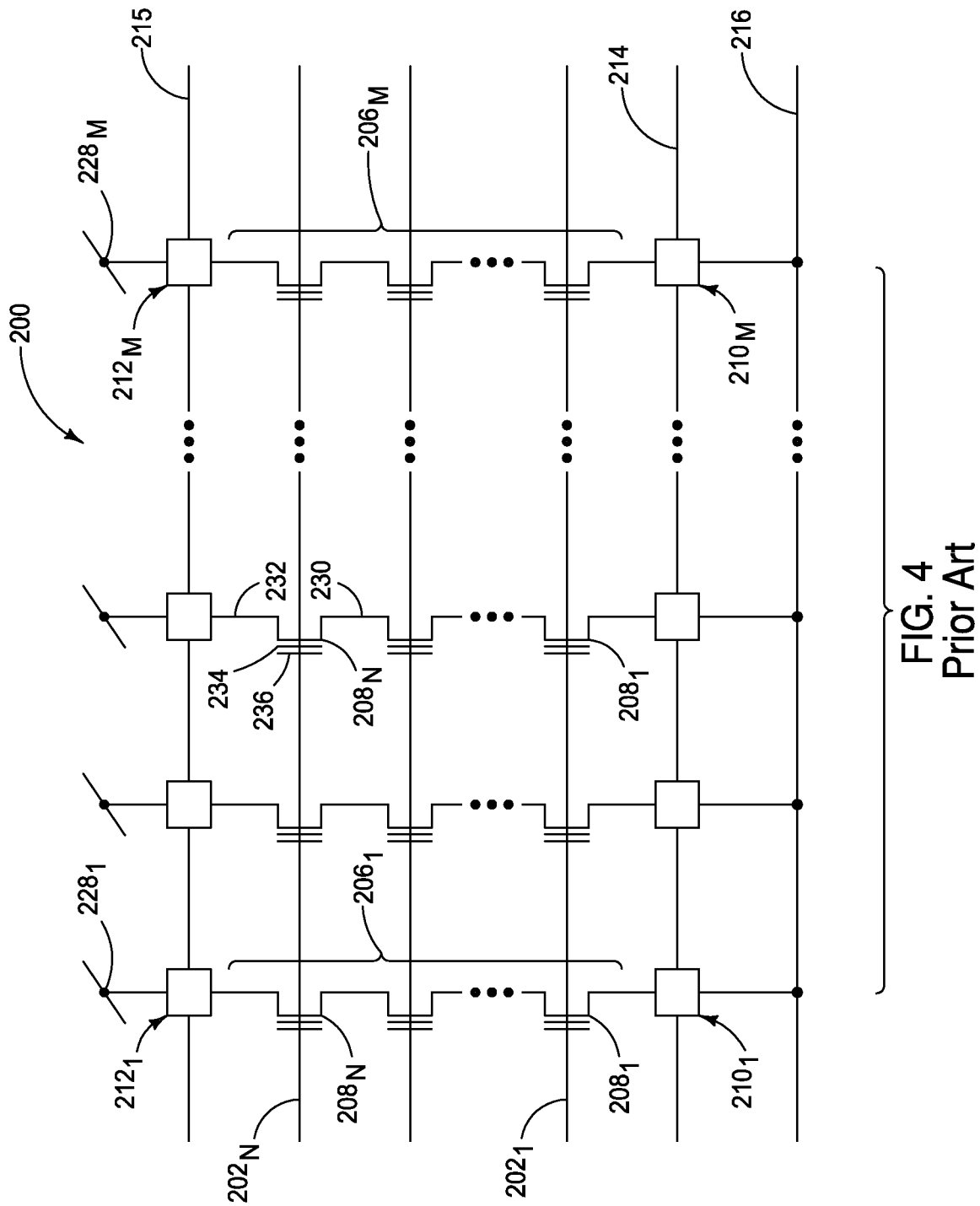
FIG. 4 is a schematic of a prior art NAND memory array.

Some embodiments include methods of coupling channel-material pillars from one deck to another in multi-deck assemblies. Some embodiments include multi-deck assemblies having some channel-material pillars of a lower deck which are coupled with channel-material pillars of an upper deck, and having at least one channel-material pillar of the lower deck which is not coupled with a channel-material pillar of the upper deck. An inter-deck region is between the upper and lower decks. Multi-material structures are over each of the channel-material pillars of the lower deck which are not coupled with the channel-material pillars of the upper deck, with the multi-material structures being in the inter-deck region. The multi-material structures may include a first material comprising oxide (e.g., aluminum oxide) over a second material to which the oxide is selectively etchable. In some embodiments, the second material may include one or more of tungsten, titanium, titanium nitride and tungsten nitride. Example embodiments are described with reference to FIGS. 5-26.

Referring to FIG. 5, a region of an integrated assembly 10 is illustrated. The assembly comprises a memory deck 14 supported by a base 12. The base 12 may comprise semiconductor material; and may, for example, comprise, consist essentially of, or consist of monocrystalline silicon. The base 12 may be referred to as a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some applications, the base 12 may correspond to a semiconductor substrate containing one or more materials associated with integrated circuit fabrication. Such materials may include, for example, one or more of refractory metal materials, barrier materials, diffusion materials, insulator materials, etc.

A gap is provided between the base 12 and the deck 14 to indicate that there may be other materials, structures, etc., between the deck 14 and the base 12.

The deck 14 includes memory cells 16 arranged in tiers 18. The tiers 18 may correspond to a wordline tiers of the type described above with reference to FIGS. 1-4 of the Background section. The tiers 18 are disposed one atop another, and are spaced from one another by insulative material 20. The memory cells 16 may correspond to NAND memory cells of the type described above with reference to FIGS. 1-4 of the Background section. The memory cells are arranged in columns 22, and each column may correspond to a string of NAND cells. Any suitable number of cells may be within each string; including, for example, 16 cells, 32 cells, 64 cells, 128 cells, 512 cells, 1024 cells, etc.

The deck 14 may be referred to as a first deck, the memory cells 16 may be referred to as first memory cells, and the tiers 18 may be referred to as first tiers.

Channel-material pillars 24 extend through the tiers 18. The channel-material pillars comprise channel material 26. The channel material may comprise any suitable semiconductor material; and in some embodiments may comprise, consist essentially of, or consist of one or more of silicon, germanium, II/V semiconductor material (e.g., gallium phosphide), semiconductor oxide, etc.; with the term II/V semiconductor material referring to semiconductor materials comprising elements selected from groups III and V of the periodic table (with groups III and V being old nomenclature, and now being referred to as groups 13 and 15). The channel-material pillars may comprise channel material suitable for utilization in the NAND configurations described above with reference to FIGS. 1-4 of the Background section.

The channel-material pillars 24 of the first deck 14 may be referred to as first channel-material pillars.

In the shown embodiment, the channel material 26 of the channel-material pillars 24 surrounds insulative material 28; and accordingly the channel-material pillars are configured as so-called "hollow-channel" structures. FIG. 5A shows a cross-section along the line A-A, and shows that the channel material 26 of the channel-material pillars 24 is configured to surround an interior region of the pillars in the illustrated embodiment. The interior region corresponds to the so-called "hollow" of the hollow-channel structures. In other embodiments, the channel-material pillars may be configured to be solid pillars of channel material rather than being the illustrated hollow-channel structures.

FIG. 5 diagrammatically shows the memory cells 16 spaced from the channel-material pillars 24 by regions of the insulative material 20. Such regions may comprise silicon dioxide and/or any other suitable insulative materials. The vertical spacing between the memory cells may comprise the same composition of insulative material 20 as is utilized between the memory cells and the channel-material pillars or may comprise a different composition of the insulative material. In some embodiments, the memory cells are vertically spaced from one another by insulative regions comprising silicon dioxide.

The memory cells may comprise any suitable configuration. In some embodiments the memory cells may comprise charge-trapping material (e.g., silicon nitride), and in other embodiments the memory cells may comprise floating gate material (e.g., polycrystalline silicon).

The channel-material pillars 24 are coupled with a source conductor structure 30. The source conductor structure comprises conductive material 32. Such conductive material may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). The conductor structure 30 may correspond to one of the source structures described above with reference to FIGS. 1-4 of the Background section (e.g., any of the source structures 216, 372, 374 and 376).

Three example channel-material pillars 24 are shown in FIG. 5. The deck 14 may comprise any suitable number of channel-material pillars.

The illustrated embodiment has select gates 34 provided between the bottom-most tier of memory cells 16 and the source conductor structure 30. The select gates may correspond to the source-side select gates (SGSs) described above with reference to FIGS. 1-4 of the Background section, and may comprise any suitable configuration.

Conductive couplers 40 are over the channel-material pillars 24. The conductive couplers comprise conductive material 41, and may be utilized for interconnecting the channel-material pillars 24 of the first deck to other channel-material pillars formed over the first deck. The conductive material 41 may comprise any suitable composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the conductive material 41 may comprise, consist essentially of, or consist of conductively-doped semiconductor material (e.g., n-type doped polysilicon).

A spacing structure 36 is over the deck 14 and along sidewalls of the conductive couplers 40. The spacing structure includes an insulative material 38, which may be considered to be configured as an insulative expanse. The insulative material 38 may comprise any suitable composition(s); and in some embodiments may comprise, consist essentially of, or consist of silicon nitride.

Etch-stop structures 42 are over the conductive couplers 40. In some embodiments, the etch-stop structures may be considered to be provided within regions which extend through the insulative expanse 36 to the conductive couplers 40. The etch-stop structures are directly over the channel-material pillars 24, with the term "directly over" meaning that the etch-stop structures are vertically-aligned with the channel-material pillars. It is noted that the etch-stop structures may be wider than the channel-material pillars in some embodiments, or narrower than the channel-material pillars, and may still be directly over the channel-material pillars as long as the etch-stop structures are vertically aligned with the channel-material pillars.

The etch-stop structures 42 may comprise any suitable composition or combination of compositions. In some embodiments, the etch-stop structures comprise a single homogeneous material 44, as shown in FIG. 5; and in other embodiments the etch-stop structures may comprise two or more different materials (i.e., may correspond to multi-material structures), as discussed in more detail below with reference to FIGS. 13, 18 and 22.

In the illustrated embodiment of FIG. 5 in which the etch-stop structure 42 comprises a single homogeneous composition 44, such composition may be anything which is selectively etchable relative to the insulative material 38 and the conductive material 41, and which has suitable etch-stop properties during fabrication of openings extending to the etch-stop material (with such fabrication being discussed below with reference to FIG. 7). The term "selectively etchable" means that a first material is removed faster than a second material under etching conditions; which includes, but is not limited to, applications in which the etching conditions do not remove any of the second material (i.e., etching conditions which are 100% selective for the first material).

In some embodiments, the etch-stop material 44 may comprise, consist essentially of, or consist of an oxide. Suitable oxides may include metal oxides; and in some embodiments the material 44 may comprise, consist essentially of, or consist of one or more of magnesium oxide, aluminum oxide, hafnium oxide and zirconium oxide. In some embodiments, the etch-stop material 44 may comprise metal-containing material corresponding to pure metal or mixtures of two or more metals (including alloys). For instance, the etch-stop material 44 may comprise, consist essentially of, or consist of one or both of titanium and tungsten. In some embodiments, the etch-stop material 44 may comprise metal in combination with nitrogen. For instance, the etch-stop material 44 may comprise, consist essentially of, or consist of one or both of tungsten nitride and titanium nitride.

Figure 6:
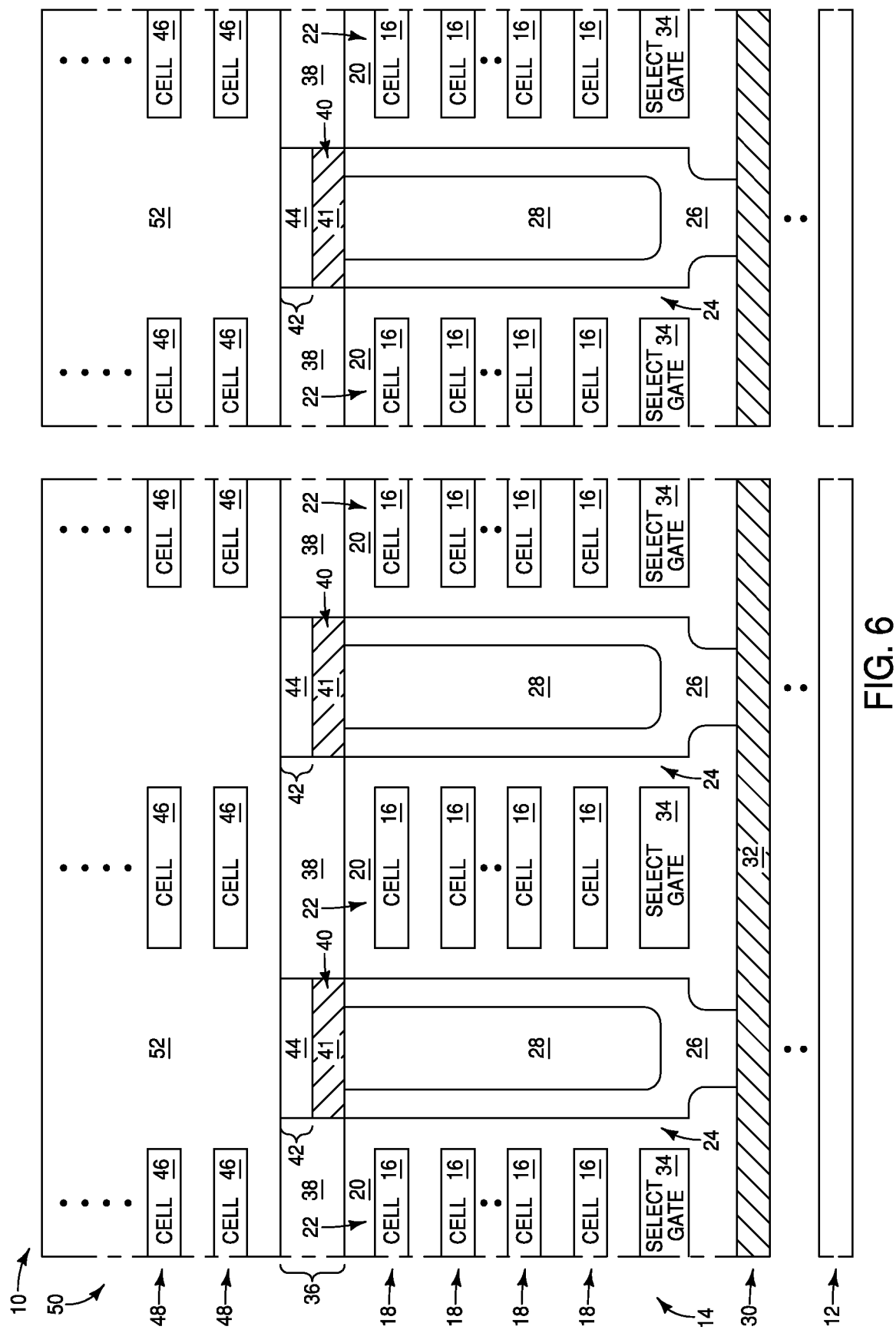

Referring to FIG. 6, a second deck 50 is formed over the first deck 14. The second deck has second memory cells 46 arranged in second tiers 48 which are disposed one atop another. The second tiers 48 are spaced from one another by intervening insulative material 52. The insulative material 52 may comprise any suitable composition(s); and in some embodiments may comprise, consist essentially of, or consist of silicon dioxide.

The second memory cells 46 may have substantially identical configurations relative to the first memory cells 16; with the term "substantially identical" meaning identical to within reasonable tolerances of fabrication and measurement.

The spacing structure 36 may be referred to as an inter-deck structure, in that it is provided between the first and second decks 14 and 50.

Figure 7:
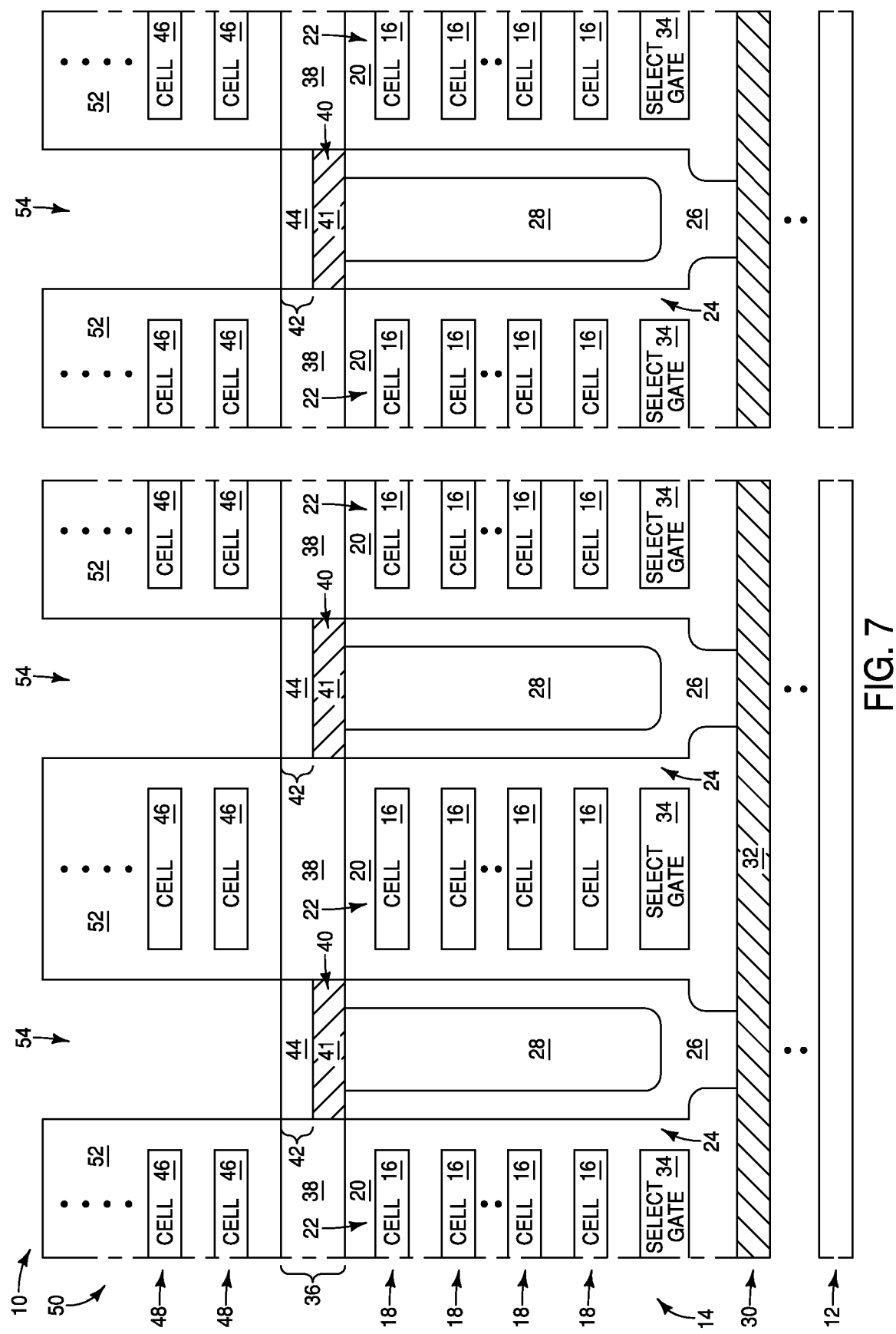

Referring to FIG. 7, openings 54 are formed through the insulative material 52 and to the etch-stop material 44. The openings are formed under conditions which remove material 52 selectively relative to the etch-stop material 44. In some embodiments, the material 52 comprises silicon dioxide and material 44 comprises aluminum oxide, which may enable the material 52 to be readily selectively removed relative to the material 44. In some embodiments, the material 52 comprises silicon dioxide and the material 44 comprises one or more of tungsten, titanium, titanium nitride and tungsten nitride, which also may enable the material 52 to be readily selectively removed relative to the material 44. Although the illustrated embodiment indicates that cells 46 and material 52 are provided before the pillar etch (i.e., the formation of openings 54), and indicates that the pillar etch only removes material 52, it is to be understood that other embodiments may include other suitable processing. For instance, at least some portions of cells 46 (or even all portions of cells 46) may be provided after the pillar etch; additional materials besides material 52 (or alternatively to material 52) may be provided prior to the pillar etch, and the pillar etch may remove regions of the additional materials in addition to (or alternatively to) removing regions of material 52; etc.

The openings 54 are shown terminating at an upper surface of the etch-stop material 44 as would occur if the etching utilized to form the openings 54 is 100% selective for the material 52 relative to the material 44. In other embodiments, the etching may be less than 100% selective for the material 52 relative to the material 44, and accordingly the openings may penetrate partially into the material 44 during the removal of the material 52.

Figure 8:
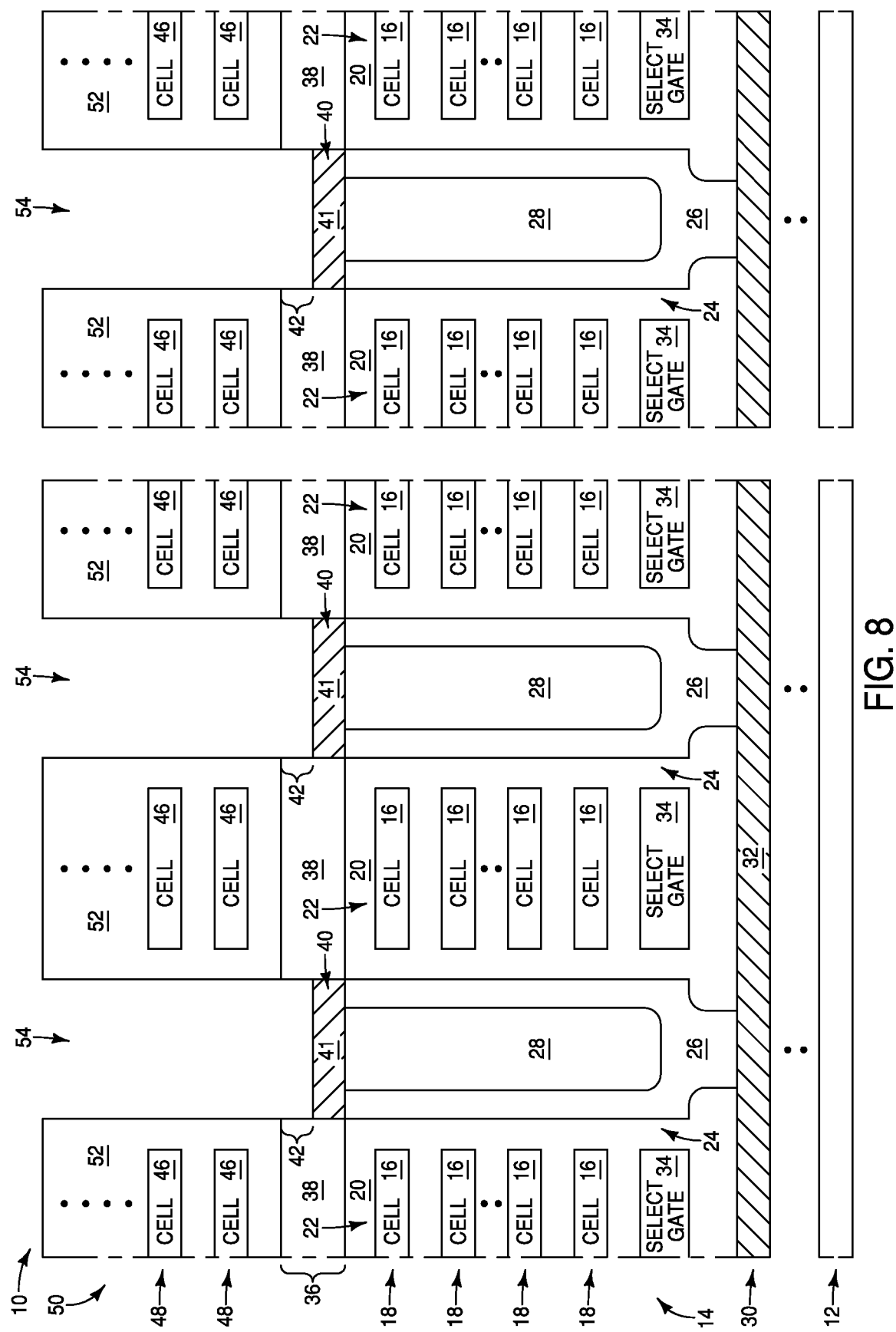

Referring to FIG. 8, the openings 54 are extended through the etch-stop structure 42 (FIG. 7) with an etch selective for the etch-stop material 44 (FIG. 7) relative to the insulative materials 38 and 52, and relative to the conductive material 41 of the conductive couplers 40. Such removes the etch-stop structures 42 to expose the conductive couplers 40. The etch is illustrated to be 100% selective for the material 44 relative to the materials 41, 38 and 52. In other embodiments, the etching utilized to remove the etch-stop material 44 may etch partially into sidewalls of the openings 54 along one or both of the insulative materials 52 and 38, and/or may etch partially into the conductive material 41 of the conductive couplers 40.

Figure 9:
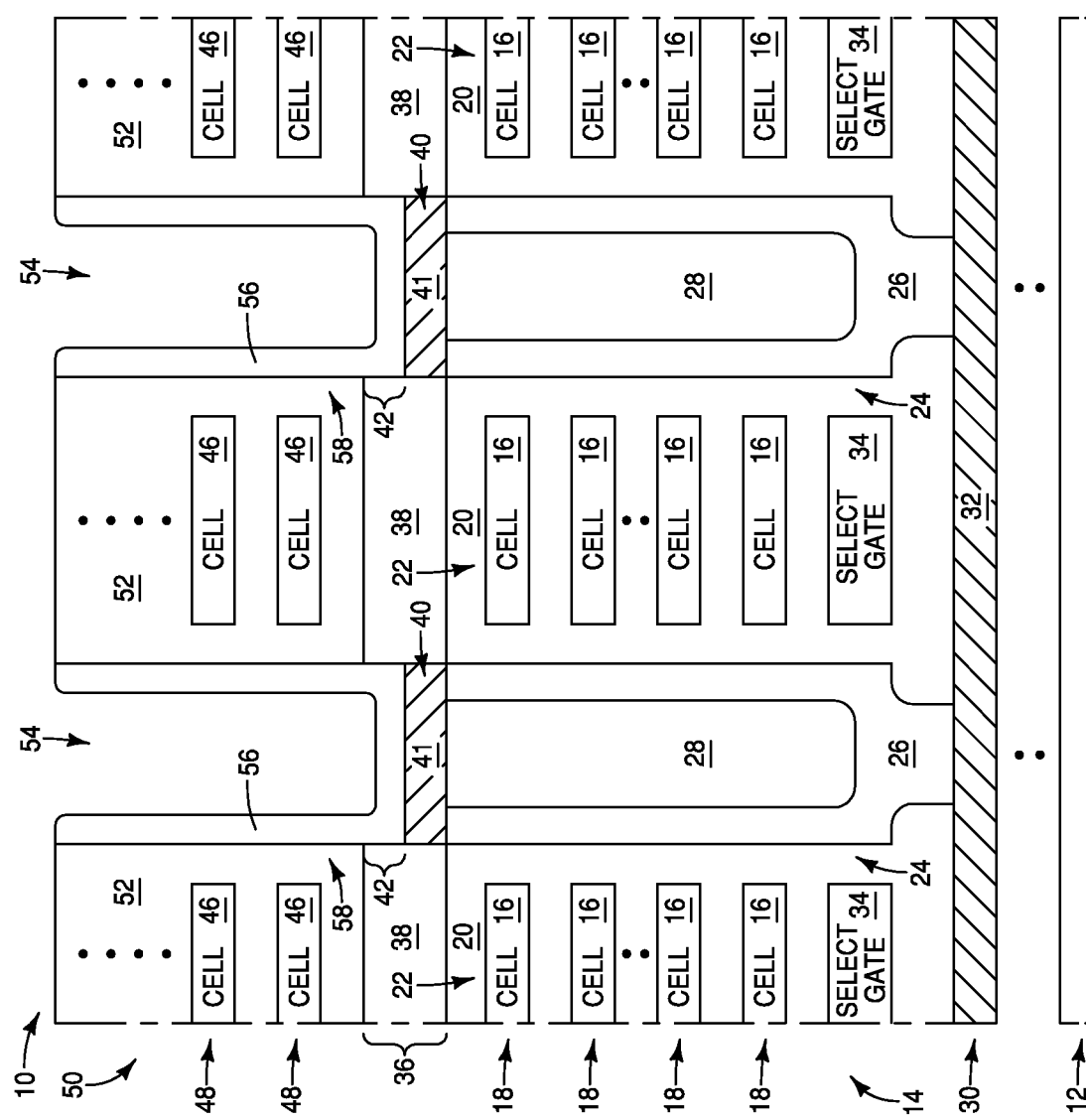

Referring to FIG. 9, channel material 56 is formed within the openings 54. The channel material 56 may comprise any of the semiconductor compositions described above as being suitable for the channel material 26. The channel material 56 may be a same composition as the channel material 26 in some embodiments, and may be a different composition relative to the channel material 26 in other embodiments. The channel material 56 is conductively coupled with the channel material 26 through the conductive couplers 40. In other embodiments, the conductive couplers 40 may be omitted, or replaced with other suitable structures; provided that desired conductive coupling between the channel materials 26 and 56 is achieved.

The channel material 56 forms second channel-material pillars 58 within the second deck 50. In the shown embodiment, the channel material 56 only partially fills the openings 54; and accordingly the second channel-material pillars 58 are configured in hollow-channel configurations. In subsequent processing (not shown) insulative material analogous to the material 28 may be formed within the hollow-channel configurations of the pillars 58. In alternative embodiments (not shown) the material 56 may entirely fill the openings 54 so that the channel-material pillars 58 are solid pillars of channel material, rather than being hollow-channel configurations.

The illustrated first channel-material pillars 24 may be considered to be representative of a large plurality of substantially-identical pillars that extend through the first tiers 28 of the first deck 14. Similarly, the second channel-material pillars 58 may be considered to be representative of a large plurality of substantially-identical pillars that extend through the second tiers 48 of the second deck 50. The first and second pillars 24/58 which are coupled to one another, together with the memory cells 16/46 along such pillars, may be considered to be representative of a large plurality of substantially-identical strings of a NAND memory. In subsequent processing (not shown) additional structures may be formed along upper portions of the strings, including, for example, drain side select gates (SGDs).

The assembly 10 of FIG. 9 may be considered to be a multi-deck assembly comprising a pair of memory decks 14 and 50 in a vertically-stacked arrangement. In other embodiments, processing analogous to that of FIGS. 5-9 may be utilized to form multi-deck assemblies having more than two stacked memory decks.

The processing of FIGS. 7-9 forms second channel-material pillars 58 coupled with each of the first channel-material pillars 24. In other processing, there may be one or more of the first channel-material pillars which is not coupled with a second channel-material pillar. Such may occur inadvertently due to mask misalignment during the formation of the second deck. Alternatively, such may be purposeful in that some regions of the first deck may be suitable for an intended purpose without being coupled to channel-material pillars of the second deck. Also, it may be that some of the first channel-material pillars 24 are formed within a region outside of an intended memory array region (i.e., within a scribe region of a wafer, as discussed in more detail below with reference to FIGS. 23-25), and accordingly may not be coupled with the second channel-material pillars as it may be understood that such first channel-material pillars are not intended to be utilized as active components of a memory array.

Figure 10:
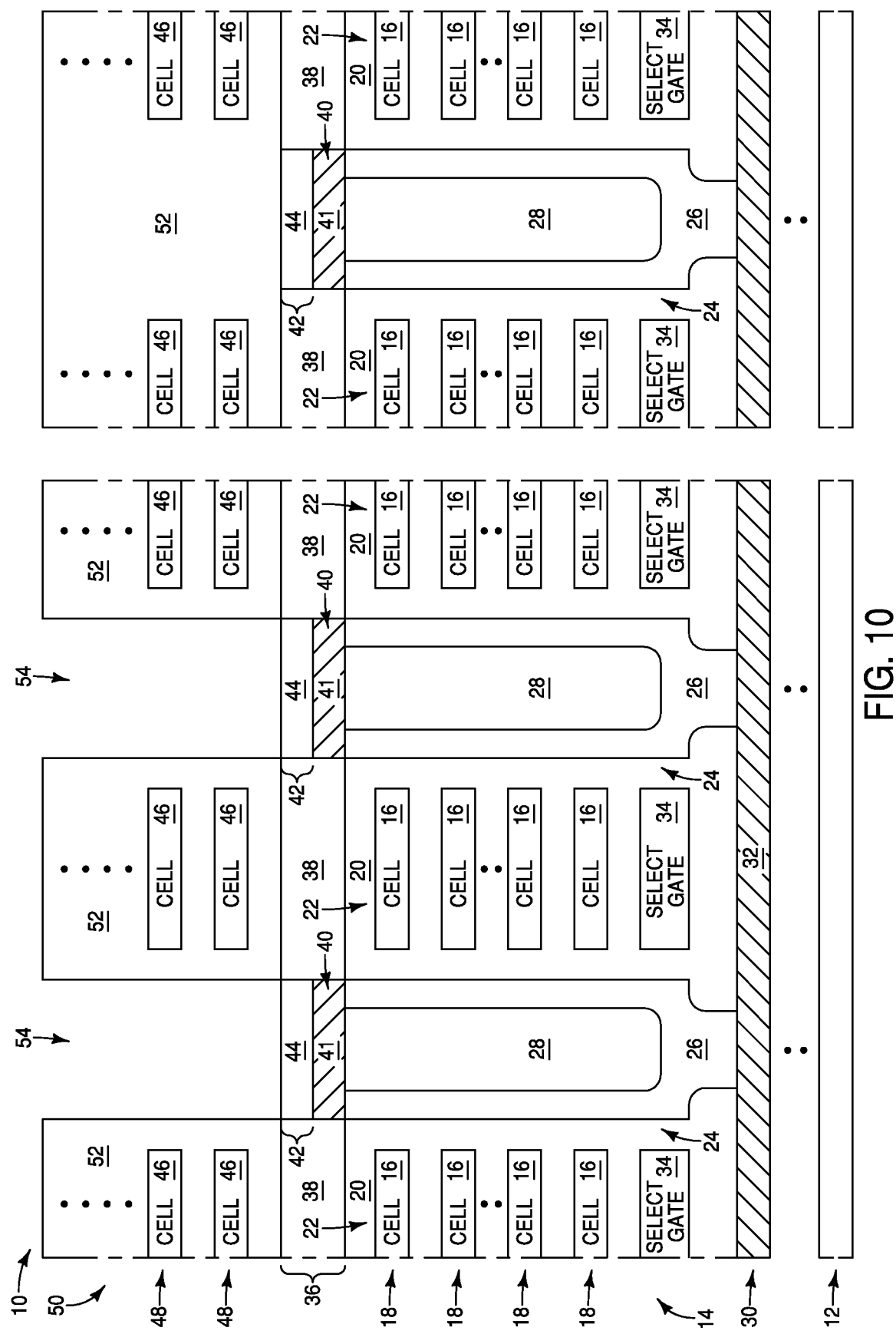
FIGS. 10-12 are diagrammatic cross-sectional side views of a region of an integrated assembly at example process stages of an example method for forming an example structure. The process stage of FIG. 10 may follow that of FIG. 6.

FIG. 10 shows the assembly 10 at a processing stage following that of FIG. 6 in accordance with an embodiment in which the openings 54 of the second deck 50 are formed over only some of the first channel-material pillars 24 of the first deck 14.

Figure 11:
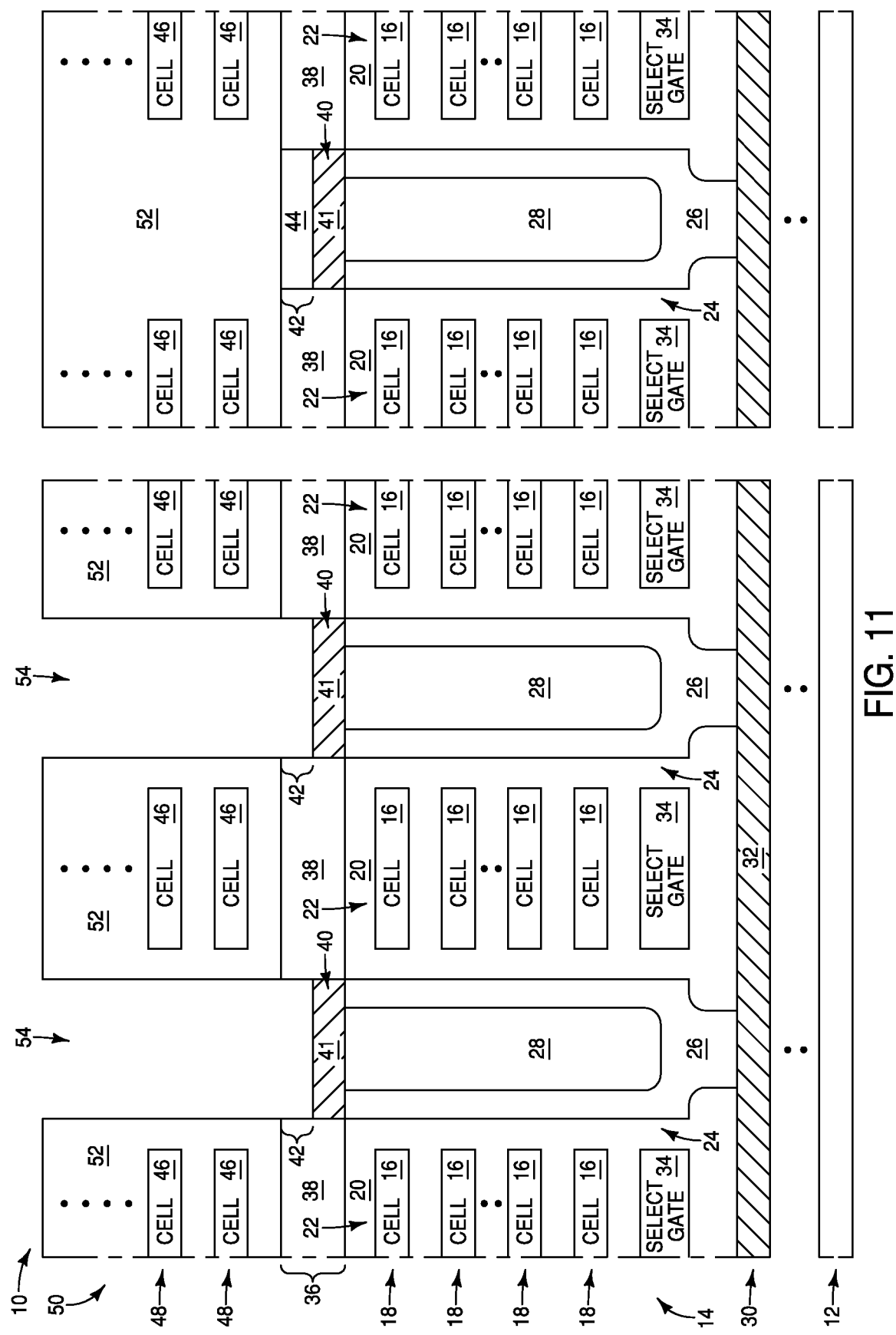

FIG. 11 shows a processing stage subsequent to that of FIG. 10; and shows the openings 54 extended through the etch-stop material 44 with processing analogous to that of FIG. 8.

Figure 12:
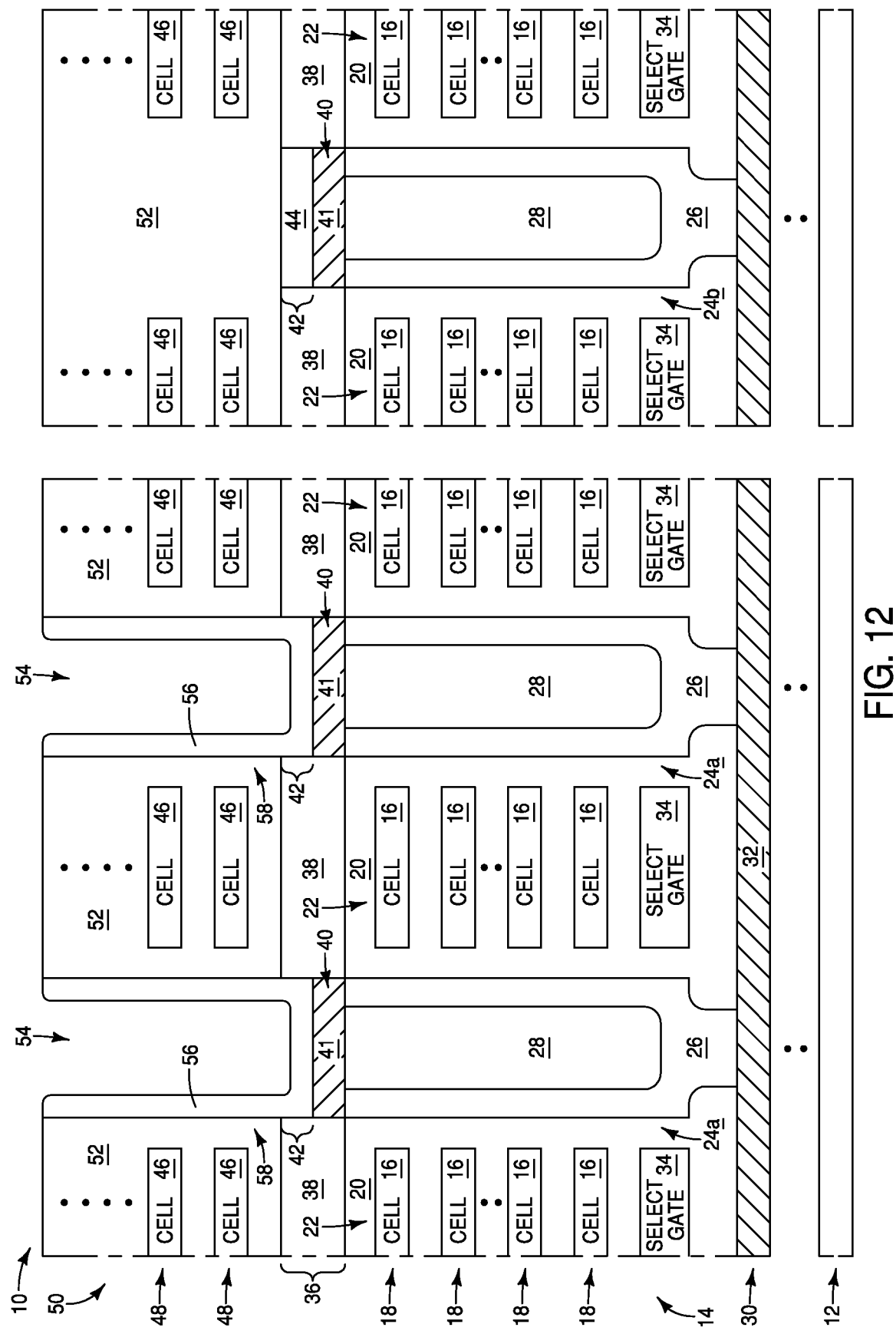

FIG. 12 shows a processing stage subsequent to that of FIG. 11; and shows the second channel-material pillars 58 is formed within the openings 54 with processing analogous to that of FIG. 9.

Two of the first channel-material pillars 24 of the assembly of FIG. 12 (labeled as 24a in FIG. 12) are coupled with a second channel-material pillars 58, and one of the illustrated first channel-material pillars 24 (labeled as 24b in FIG. 12) is not coupled with a second channel-material pillar. Instead, the channel-material pillar 24b remains covered by the etch-stop structure 42.

Figure 13:
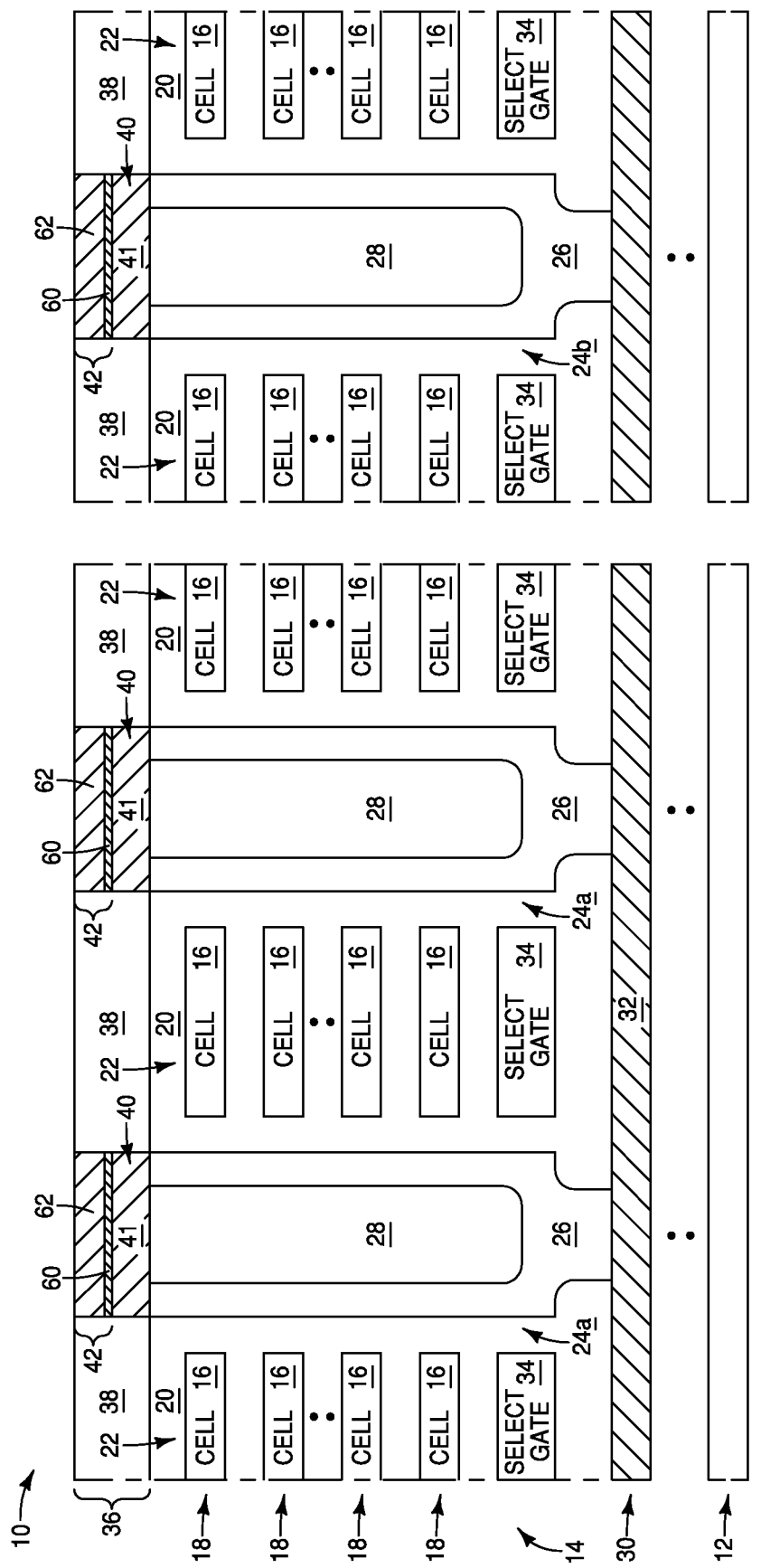
FIGS. 13-16 are diagrammatic cross-sectional side views of a region of an integrated assembly at example process stages of an example method for forming an example structure.

As discussed above, in some embodiments the etch-stop structures 42 may comprise two or more different materials. FIG. 13 shows the assembly 10 at a process stage analogous to that of FIG. 5, but in accordance with an embodiment in which the etch-stop structures 42 comprise two different materials 60 and 62.

The materials 60 and 62 may comprise any suitable composition(s), and in the shown embodiment are both illustrated to be conductive. In some embodiments, the material 60 may comprise a metal nitride. For instance, the material 60 may comprise, consist essentially of, or consist of one or both of titanium nitride and tungsten nitride. In some embodiments, the material 62 may comprise elemental metal, either alone or in a mixture with other elemental metals (with the term "mixture" including alloys). For instance, the material 62 may comprise, consist essentially of, or consist of one or both of tungsten and titanium. The material 60 may be provided as a liner to preclude undesired reactions between the material 62 and the material 41 of the conductive coupler 40. For instance, if the material 41 comprises silicon and material 62 comprises elemental tungsten, it may be desired to form a metal nitride liner between the materials 41 and 62. If there is no problematic reaction between the materials 41 and 62, then the material 60 may be omitted in some embodiments. Also, although only two materials are shown within the etch-stop structures 42, in other embodiments there may be more than two materials. For instance, a metal silicide may be formed between the metal nitride 60 and the silicon-containing material 41 in some embodiments. If multiple materials are utilized within the etch-stop structures 42, such materials may be all conductive materials in some embodiments, or may include one or more insulative materials.

Figure 14:
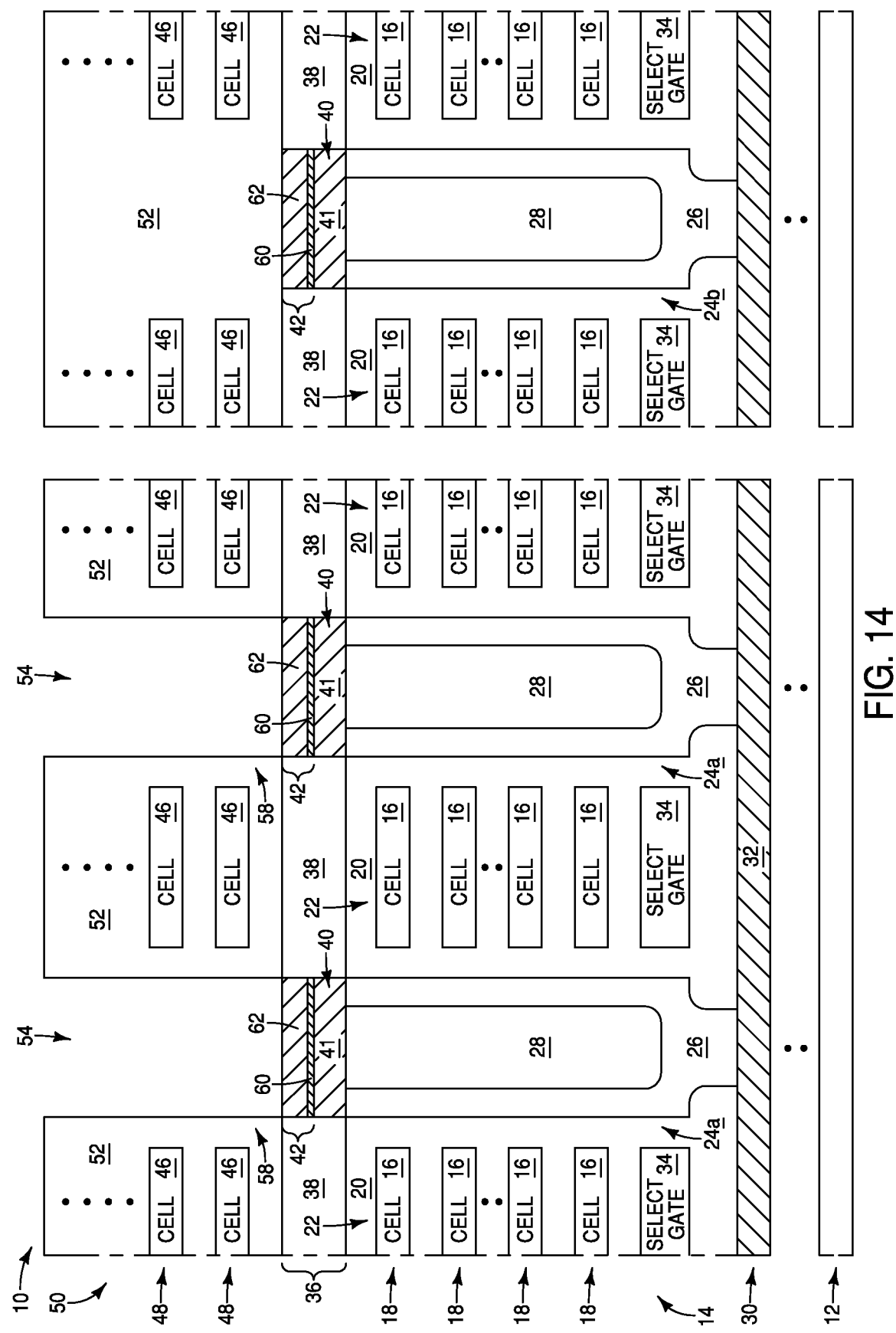

FIG. 14 shows the construction 10 at a processing stage subsequent to that of FIG. 13, and analogous to that of FIG. 11. Specifically, the second deck 50 is provided over the first deck 14, and then the openings 54 are formed through the second deck. The openings 54 are formed to extend over only some of the first channel-material pillars 24 (labeled as 24a in FIG. 14), while leaving another of the first channel-material pillars 24 without an opening thereover (such channel-material pillar is labeled as 24b in FIG. 14). In other embodiments, the openings 54 may be formed over all of the first channel-material pillars analogously to the processing described above with reference to FIG. 7.

Figure 15:
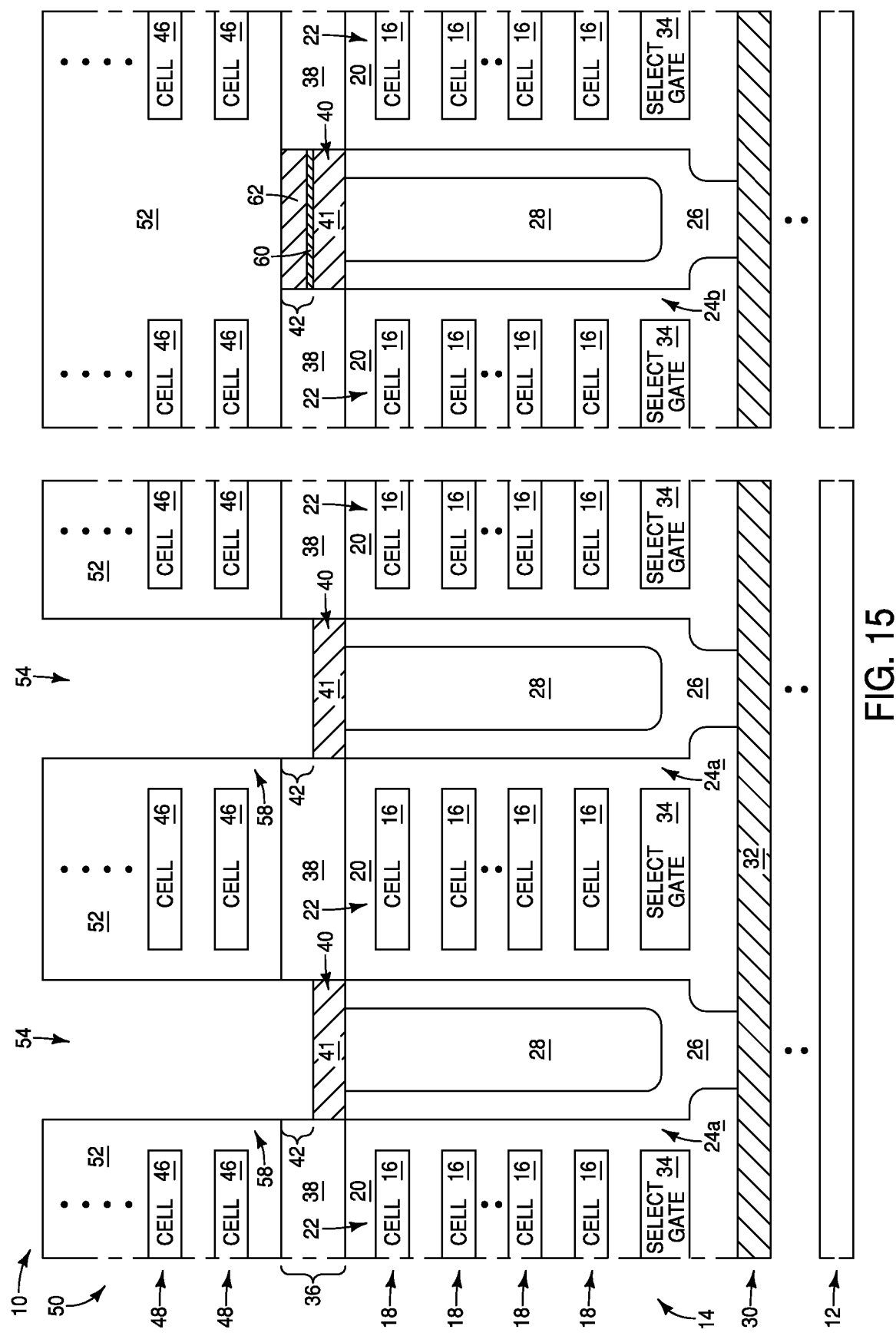

FIG. 15 shows the construction 10 at a processing stage subsequent to that of FIG. 14; and shows the openings 54 extended through the etch-stop structures 42 with processing analogous to that of FIGS. 8 and 11.

Figure 16:
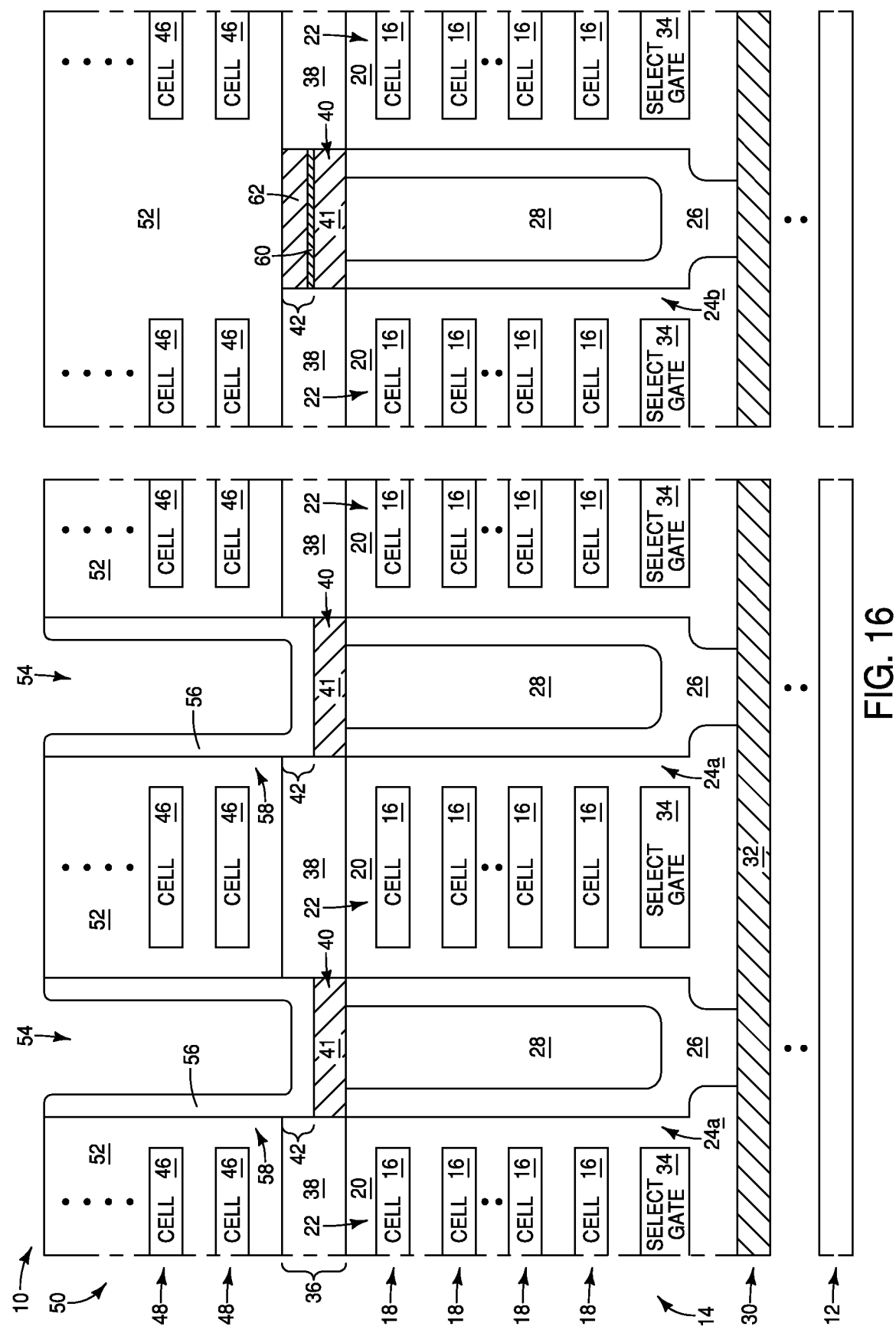

FIG. 16 shows a processing stage subsequent to that of FIG. 15; and shows the second channel-material pillars 58 formed within the openings 54 with processing analogous to that of FIGS. 9 and 12. The assembly 10 of FIG. 16 comprises a multi-material structure 42 over the first channel-material pillar 24b, with such multi-material structure extending into the insulative material 38 of the inter-deck structure 36. Although only a single of the first-channel material pillars is illustrated in the configuration of the pillar 24b as being not coupled with a second channel-material pillar 56, it is to be understood that in some embodiments the pillar 24b may be representative of a plurality of substantially-identical first channel-material pillars which are not coupled with second channel-material pillars; and instead are covered by multi-material structures analogous to the structure 42 of FIG. 16.

The illustrated embodiment of FIG. 16 shows the multi-material structure 42 directly against the conductive coupler 40. In other embodiments, the multi-material structure 42 may be provided in other configurations. For instance, the conductive coupler 40 may be omitted, or may be replaced with a different structure.

Figure 17:
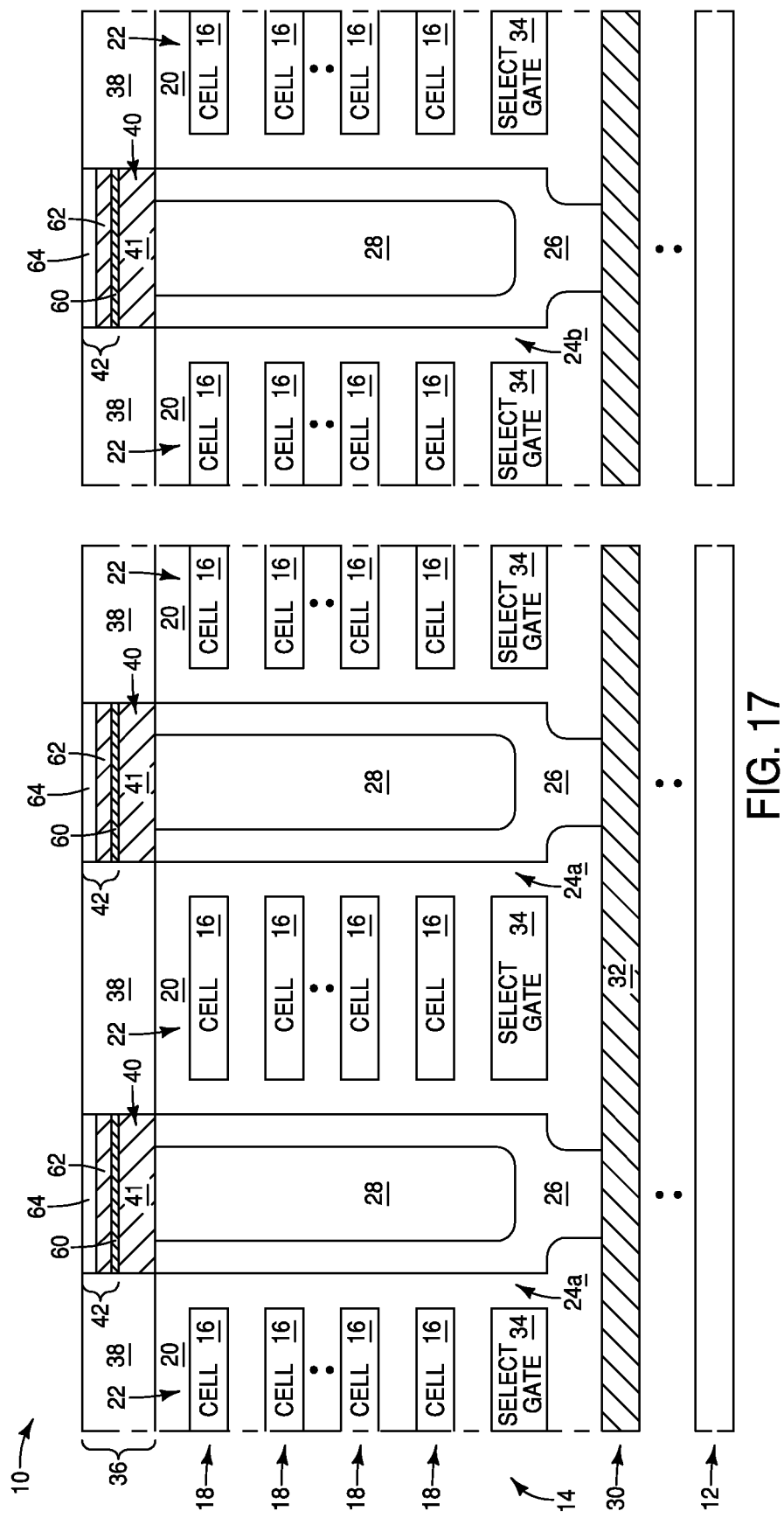
FIGS. 17-20 are diagrammatic cross-sectional side views of a region of an integrated assembly at example process stages of an example method for forming an example structure.

FIG. 17 shows the assembly 10 at a process stage analogous to that of FIG. 13, but in accordance with an embodiment in which the etch-stop structures 42 comprise an alternative multi-material configuration. Specifically, the etch-stop structures 42 of FIG. 17 comprise the materials 60 and 62, and further comprise a third material 64. The material 64 may comprise any suitable composition; and in some embodiments may comprise, consist essentially of, or consist of an oxide. For instance, the material 64 may comprise, consist essentially of, or consist of a metal oxide; such as, for example, one or more of magnesium oxide, aluminum oxide, hafnium oxide and zirconium oxide. In some embodiments, the material 64 may correspond to a metal oxide, and the materials 60 and 62 under the metal oxide may be metal-containing materials which are not oxides. In such embodiments, the materials 60 and 62 may comprise, for example, one or more of tungsten, tungsten nitride, titanium and titanium nitride.

An advantage of utilizing a multi-material etch-stop structure can be that the heterogeneous structure provides an opportunity to tailor the structure for particular applications. For instance, in some embodiments, the multi-material structure 42 may comprise aluminum oxide over tungsten (e.g., the material 64 may comprise aluminum oxide and the material 62 may comprise tungsten). An advantage of the configuration in which the aluminum oxide is over the tungsten may be that such takes advantage of the desired properties of each material, while avoiding problems that may be associated with the materials. Specifically, an advantage of aluminum oxide can be that the material etches rapidly, especially when compared with a metal (e.g. tungsten). However, a disadvantage is that the selectivity of various etches toward aluminum oxide may be relatively low as compared to the selectivity toward "harder" materials (e.g., tungsten), and accordingly a greater thickness of aluminum oxide may be necessary to achieve a full stop as compared to the thickness of harder material. In contrast, an advantage of tungsten is its hardness. However, a disadvantage is that if the tungsten is too thick there may be severe taper along sidewalls of an opening which penetrates the tungsten. The multi-material design of the etch-stop structure 42 enables a thin amount of aluminum oxide 64 to be utilized since the harder etch-stop tungsten (material 62) is under the aluminum oxide 64. Also, the tungsten may be thin since the tungsten does not have to extend across the entire thickness of the etch-stop structure 42.

Figure 18:
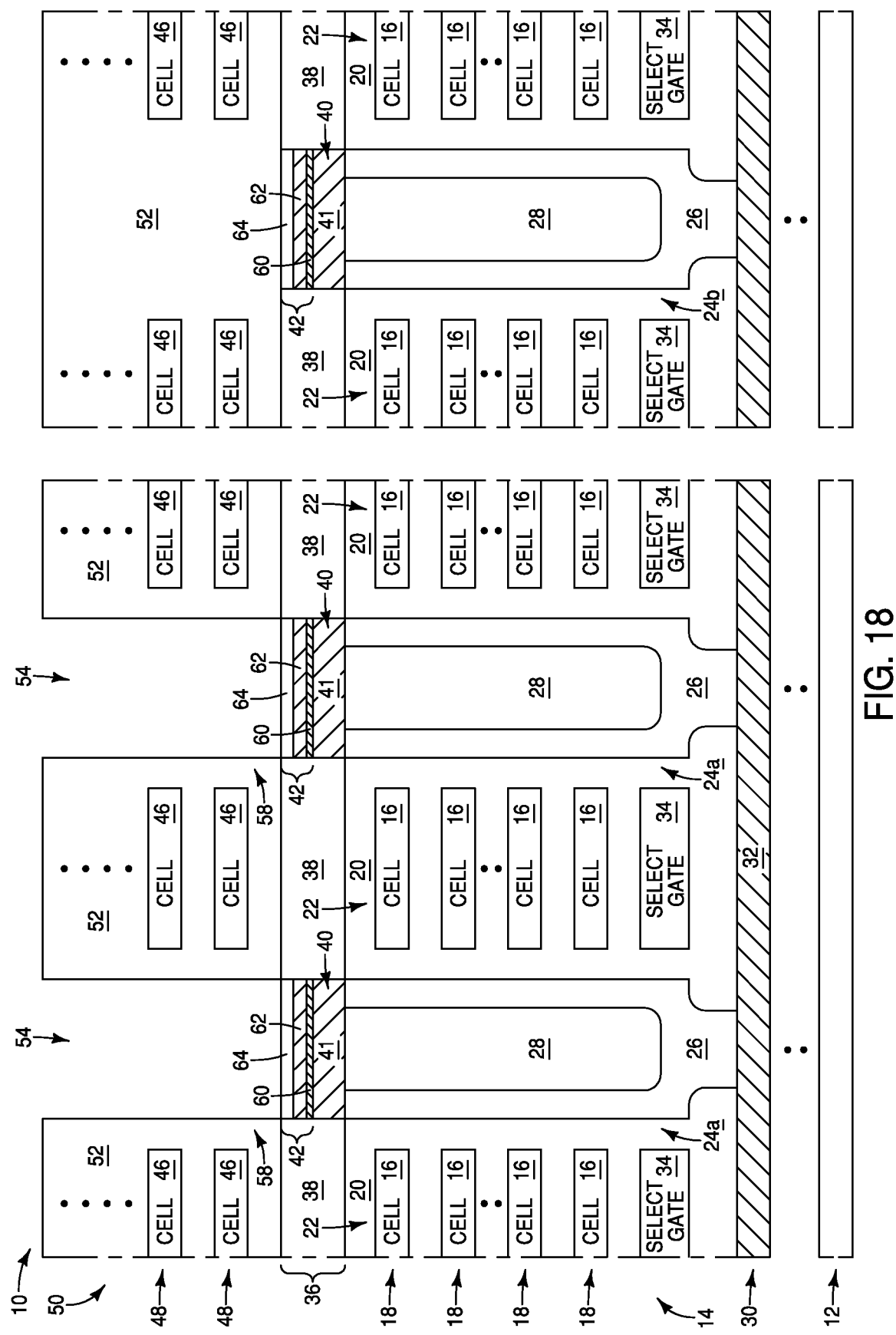

FIG. 18 shows the construction 10 at a processing stage subsequent to that of FIG. 17, and analogous to that of FIG. 14. Specifically, the second deck 50 is provided over the first deck 14, and then the openings 54 are formed through the second deck. The openings 54 are formed to extend over only some of the first channel-material pillars 24 (labeled as 24a in FIG. 18), while leaving another of the first channel-material pillars 24 without an opening thereover (such channel-material pillar is labeled as 24b in FIG. 18). In other embodiments, the openings 54 may be formed over all of the first channel-material pillars analogously to the processing described above with reference to FIG. 7.

Figure 19:
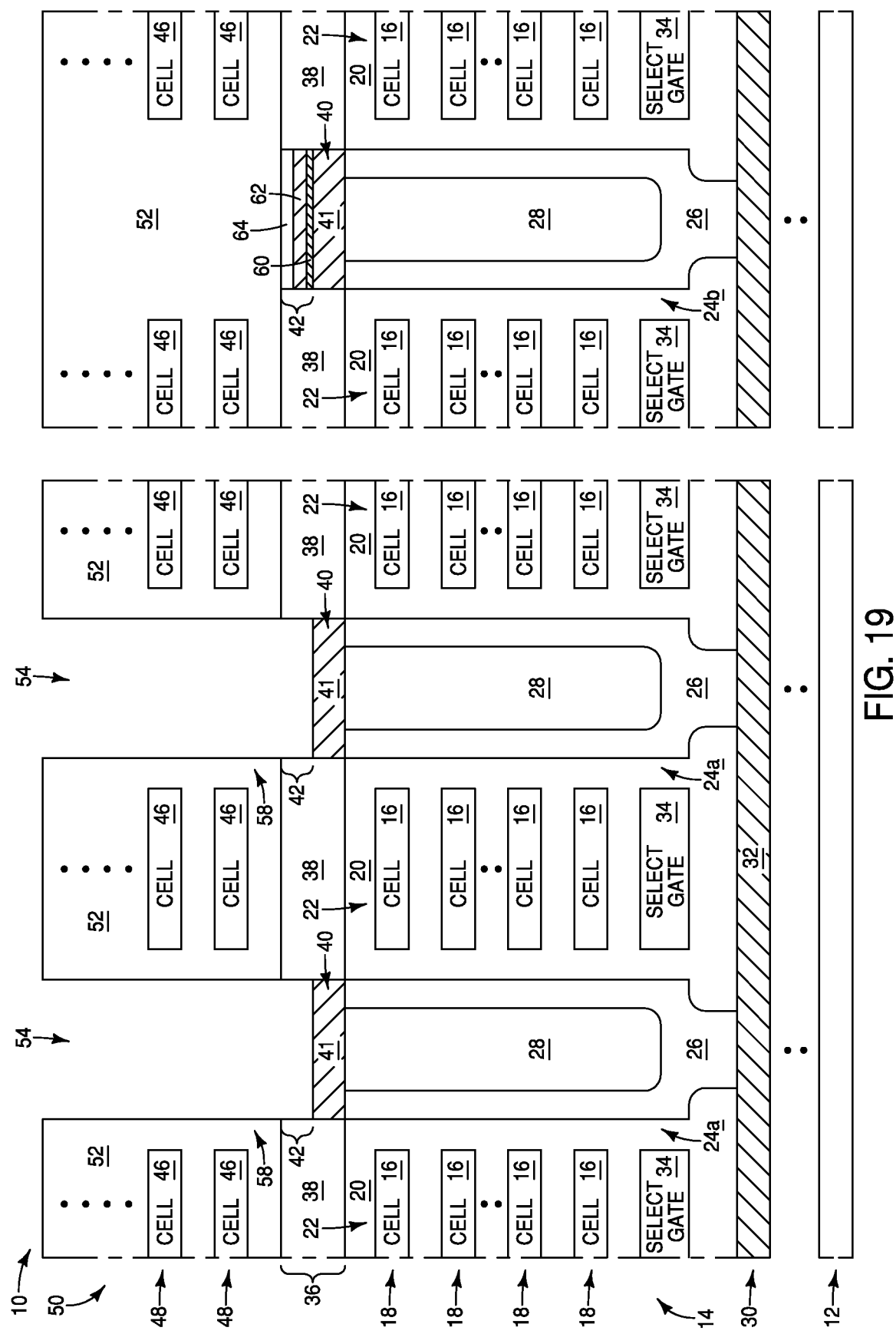

FIG. 19 shows the construction 10 at a processing stage subsequent to that of FIG. 18; and shows the openings 54 extended through the etch-stop structures 42.

Figure 20:
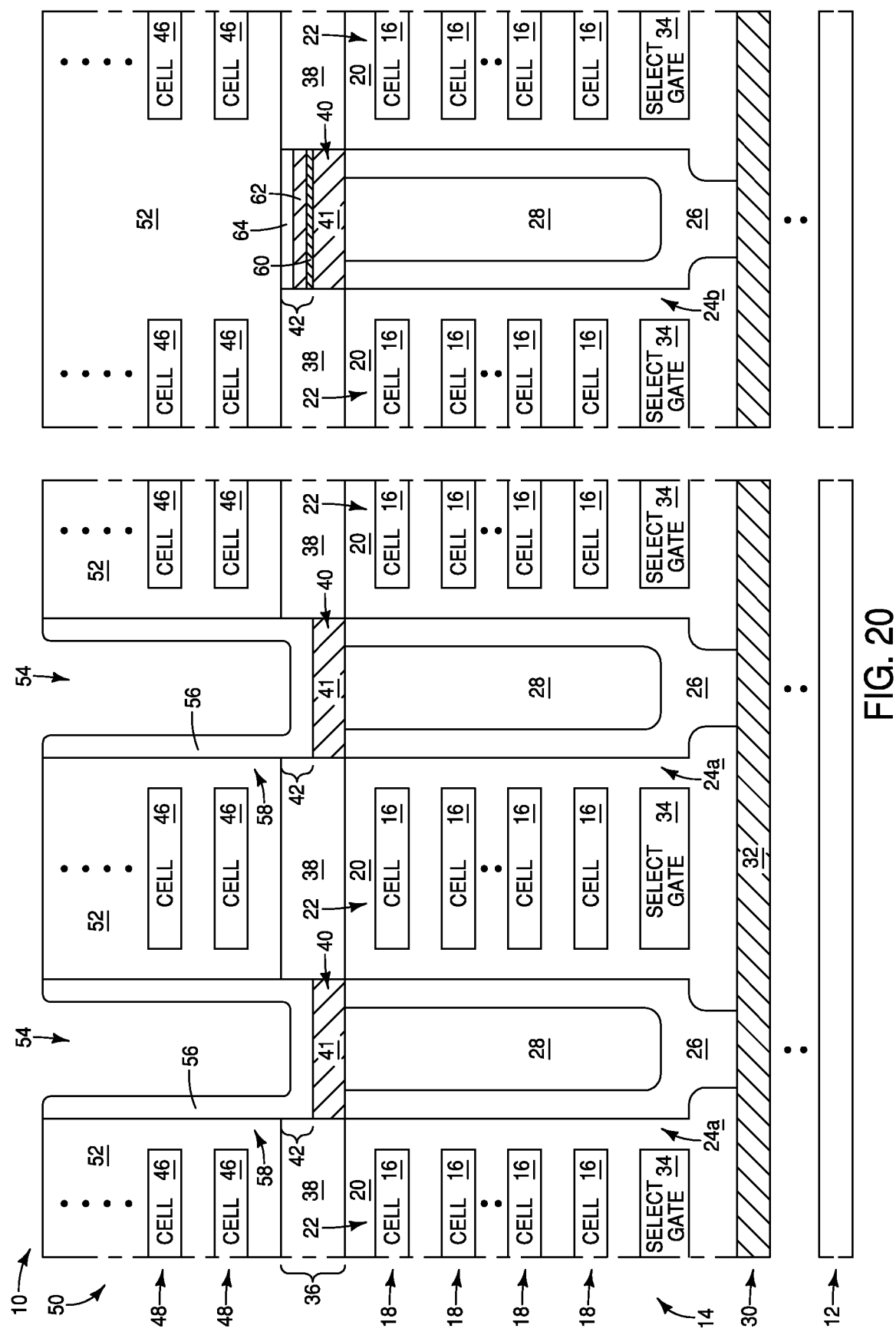

FIG. 20 shows a processing stage subsequent to that of FIG. 19; and shows the second channel-material pillars 58 formed within the openings 54. The assembly 10 of FIG. 20 comprises a multi-material structure 42 over the first channel-material pillar 24b, with such multi-material structure extending into the insulative material 38 of the inter-deck structure 36. Although only a single of the first-channel material pillars is illustrated in the configuration of the pillar 24b as being not coupled with a second channel-material pillars 56, it is to be understood that in some embodiments the pillar 24b may be representative of a plurality of substantially-identical first channel-material pillars which are not coupled with a second channel-material pillars, and instead are covered by multi-material structures analogous to the structure 42 of FIG. 20.

Figure 21:
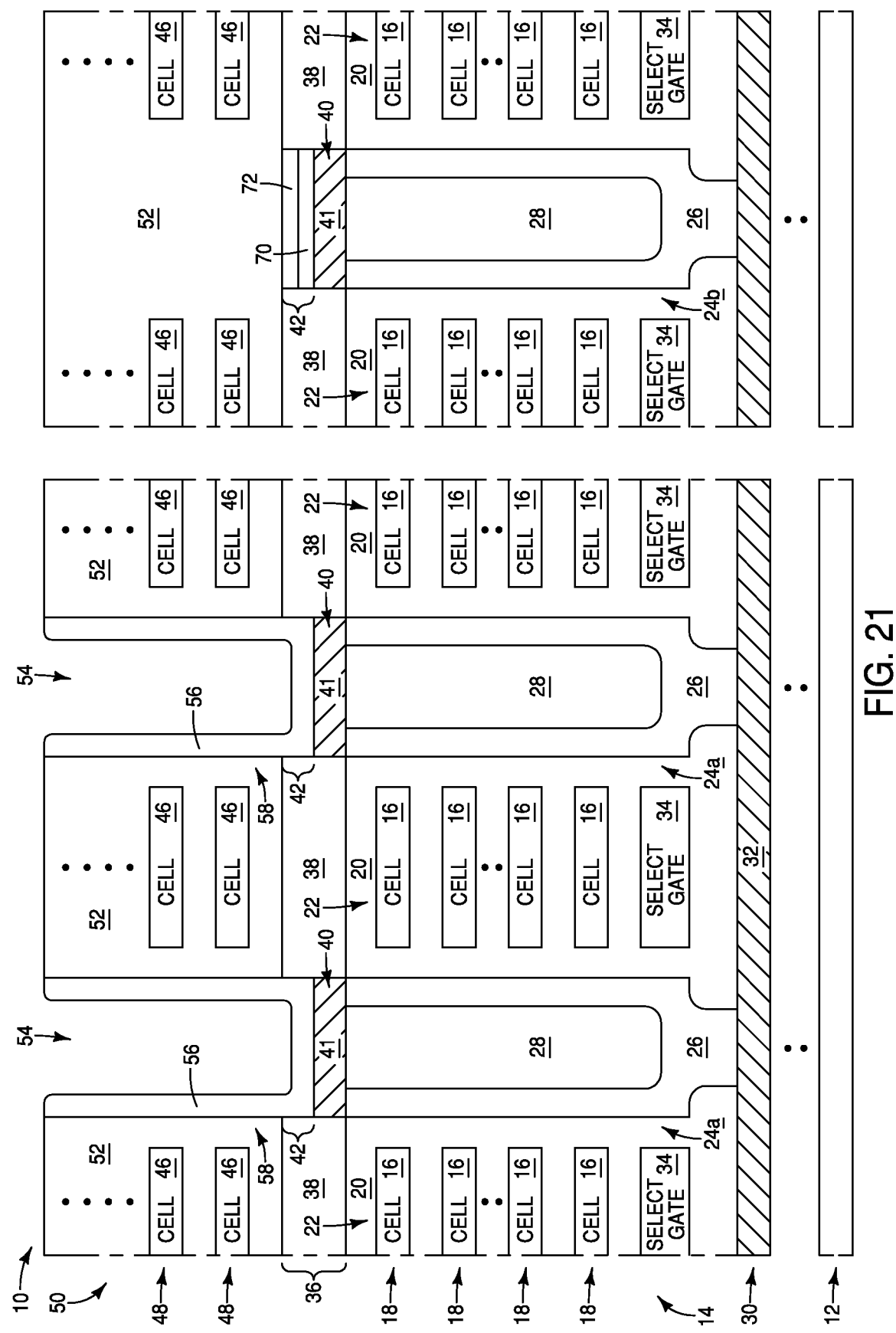
FIG. 21 is a diagrammatic cross-sectional side view of a region of an integrated assembly comprising an example multi-deck structure.

FIG. 21 shows assembly 10 in a configuration analogous to that of FIGS. 16 and 20 in which some of the first channel-material pillars 24 (labeled as pillars 24a) are coupled with the second channel-material pillars 58, and another of the first channel-material pillars 24 (labeled as a pillar 24b) is not coupled with the second channel-material pillars. Instead, the pillar 24b remains covered by the multi-material etch-stop structure 42. The structure 42 of FIG. 21 is intended to generically illustrate the various configurations of multi-material etch-stop structures described herein. The structure 42 comprises two materials 70 and 72, but in other embodiments may comprise more than two materials. The materials 70 and 72 may comprise any suitable materials. In some embodiments, the materials may both be insulative (e.g., may both comprise insulative metal oxides), may both be conductive (e.g., may both comprise conductive metal-containing compositions), or one may be conductive while the other is insulative. The conductivity of the materials 70 and 72 is generally not of concern. Rather, it is the etch selectivity provided by the materials 70 and 72 which is generally of more concern. The conductivity of the materials 70 and 72 is indicated in some embodiments described herein to assist the reader in understanding some classes of materials which are suitable for utilization in the etch-stop structure 42.

Figure 22:
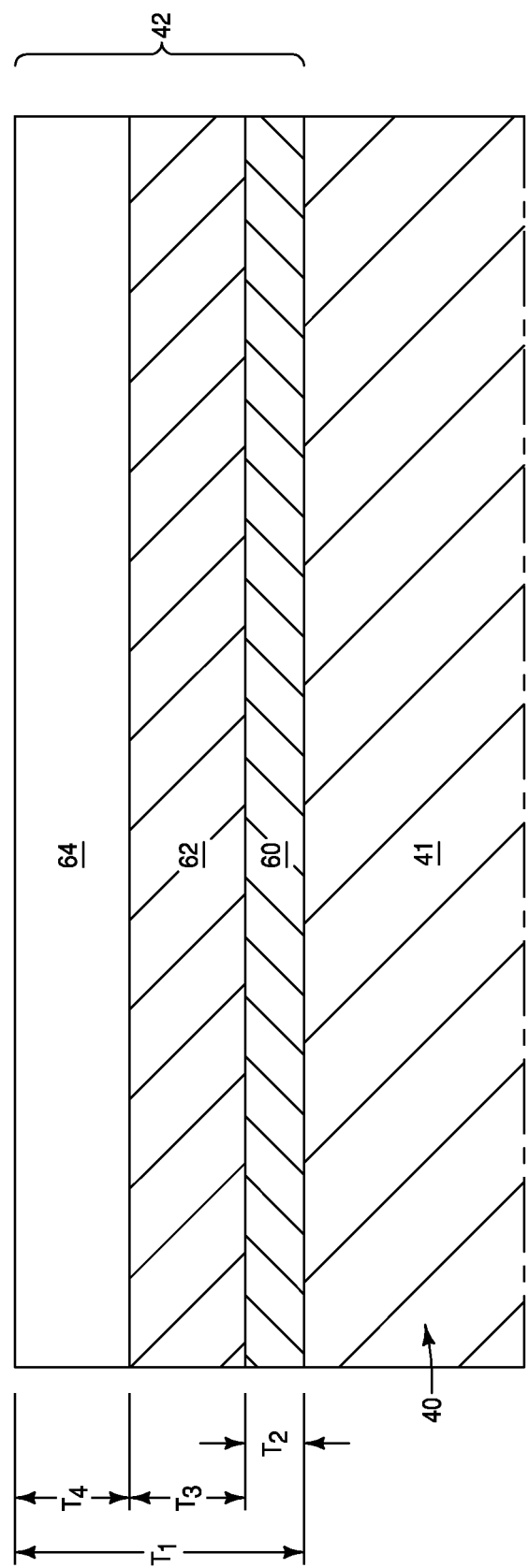
FIG. 22 is a diagrammatic cross-sectional side view of a region of an example multi-material assembly that may be incorporated into example multi-deck structures.

The multi-material etch-stop structure 42 may have any suitable thickness. FIG. 22 shows an example multi-material etch-stop structure 42 to indicate some suitable dimensions. The dimensions are provided to assist the reader in understanding some embodiments of the invention, and are not to limit the invention except to the extent, if any, that such dimensions are expressly recited in the claims which follow. The structure 42 of FIG. 22 has the configuration described above with reference to FIG. 17, and accordingly comprises the materials 60, 62 and 64. The structure 42 has an overall thickness $T_1$ which may be within a range of from about 10 nanometers (nm) to about 300 nm. The material 60 may correspond to a liner comprising nitrogen and one or both of titanium and tungsten. Such liner may have a thickness $T_2$ within a range of from about 10 angstroms (Å) to about 5 nm. The material 62 may be considered to be a mid-level material, and may comprise, consist essentially of, or consist of one or both of tungsten and titanium. The mid-level material may have a thickness $T_3$ within a range of from about 5 nm to about 150 nm. The material 64 may be considered to be an upper-level material. The material 64 may comprise metal oxide; and in some embodiments may comprise, consist essentially of, or consist of aluminum oxide. The upper-level material 64 may have a thickness $T_4$ within a range of from about 5 nm to about 150 nm.

Figure 23:
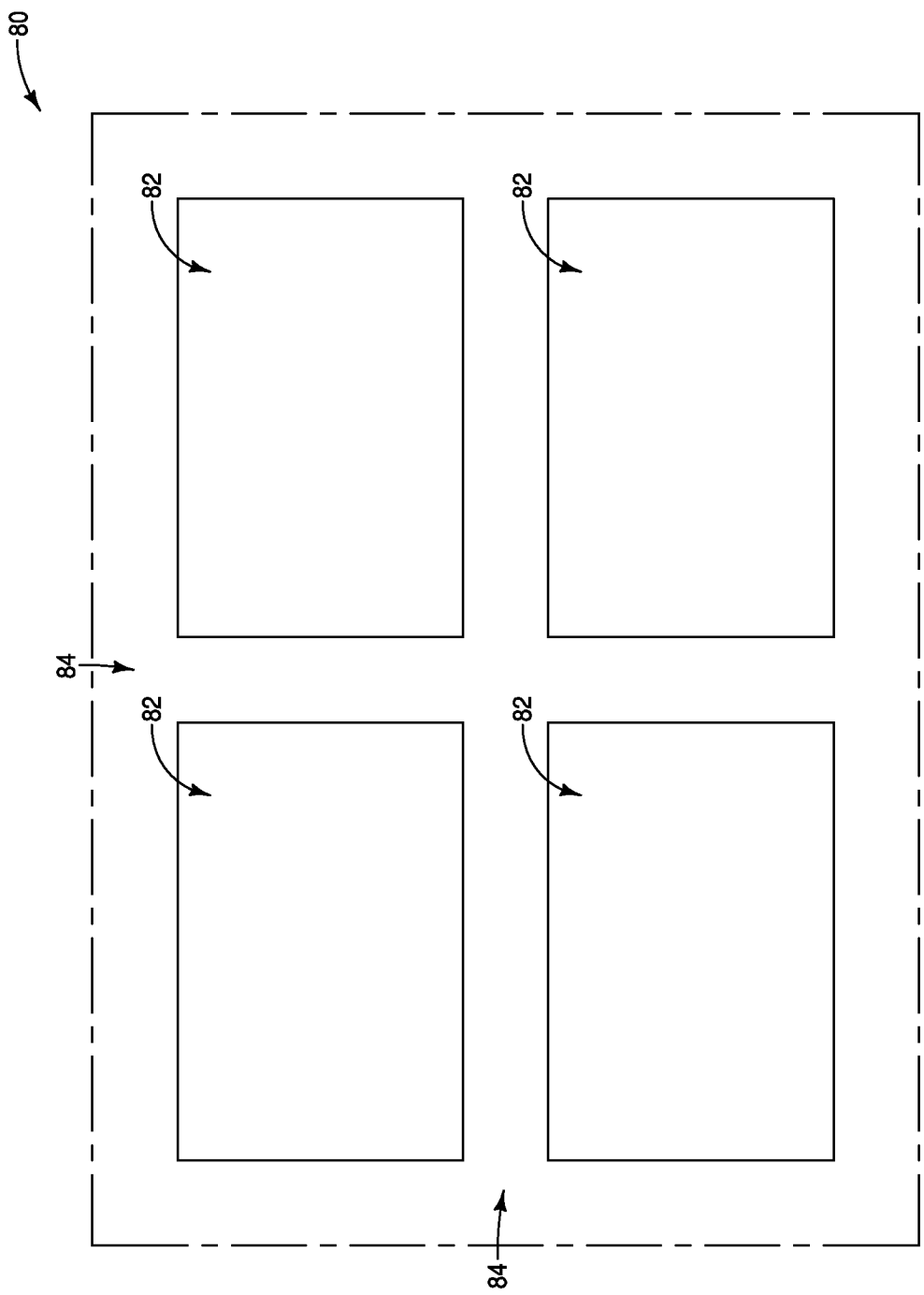
FIG. 23 is a diagrammatic top-down view of a region of a semiconductor wafer.

The multi-deck assemblies described herein may be fabricated across die locations of a semiconductor wafer. For instance FIG. 23 shows a region of a wafer 80 comprising a plurality of die locations 82. The die locations are illustrated to be rectangular, but may have any suitable shape.

The die locations are spaced from one another by intervening regions 84, which may be referred to as scribe locations. The multi-deck assemblies may comprise memory circuitry formed within the die locations. The first channel-material pillars 24b (e.g., FIG. 20) covered by multi-material etch-stop structures 42 (e.g., FIG. 20) may be present in the die locations 82 and/or in the scribe locations 84.

Figure 24:
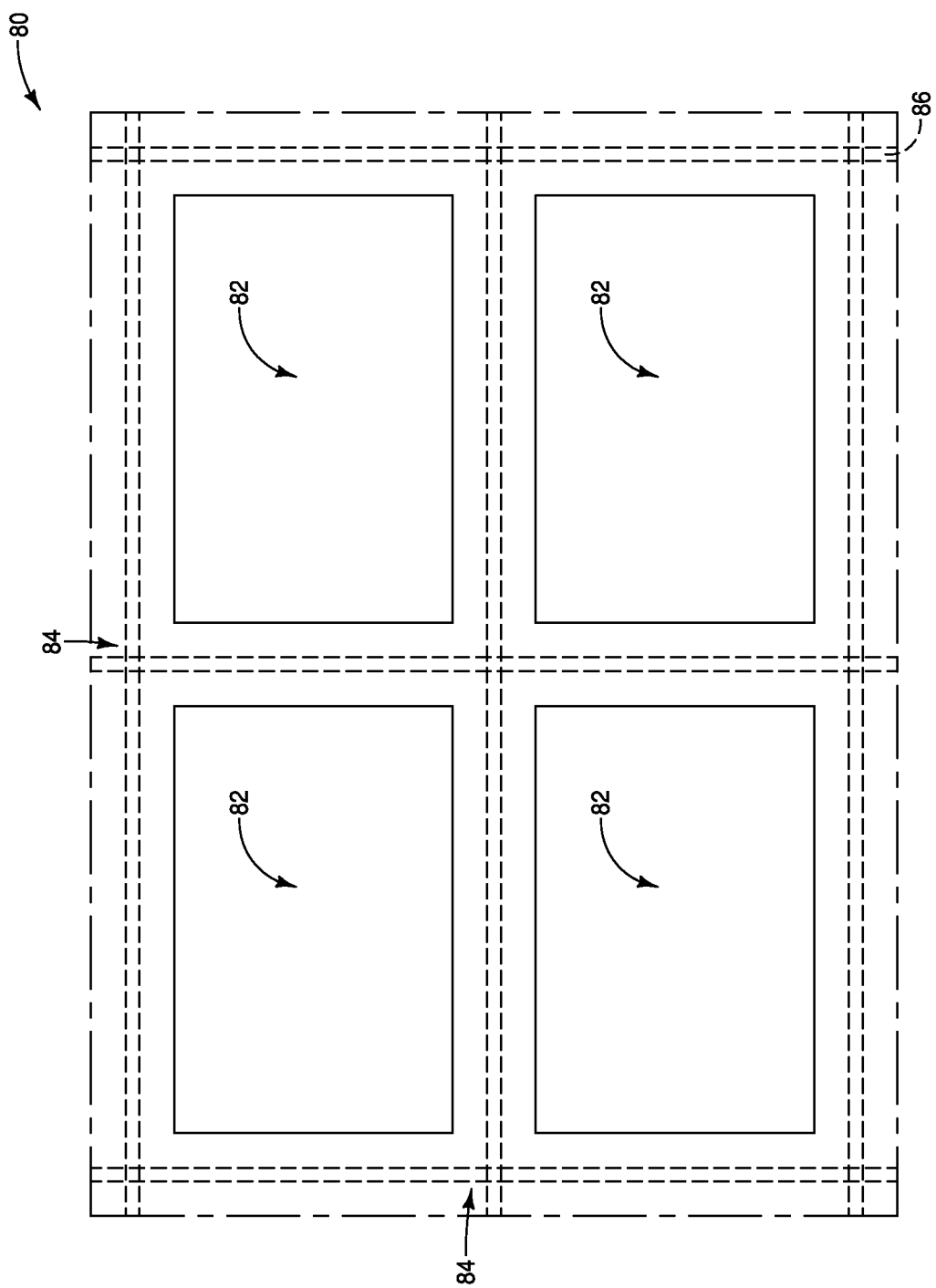
FIG. 24 is a diagrammatic top-down view of a region of the semiconductor wafer of FIG. 23 showing cut locations utilized to singulate dies from the wafer.

After desired circuitry is formed within the die locations 82, the wafer 80 is sliced along the intervening regions 84 to separate finished dies from one another, and to thereby singulate the dies. FIG. 24 diagrammatically illustrates kerfs 86 to indicate cutting utilized to separate the dies from one another.

Figure 25:
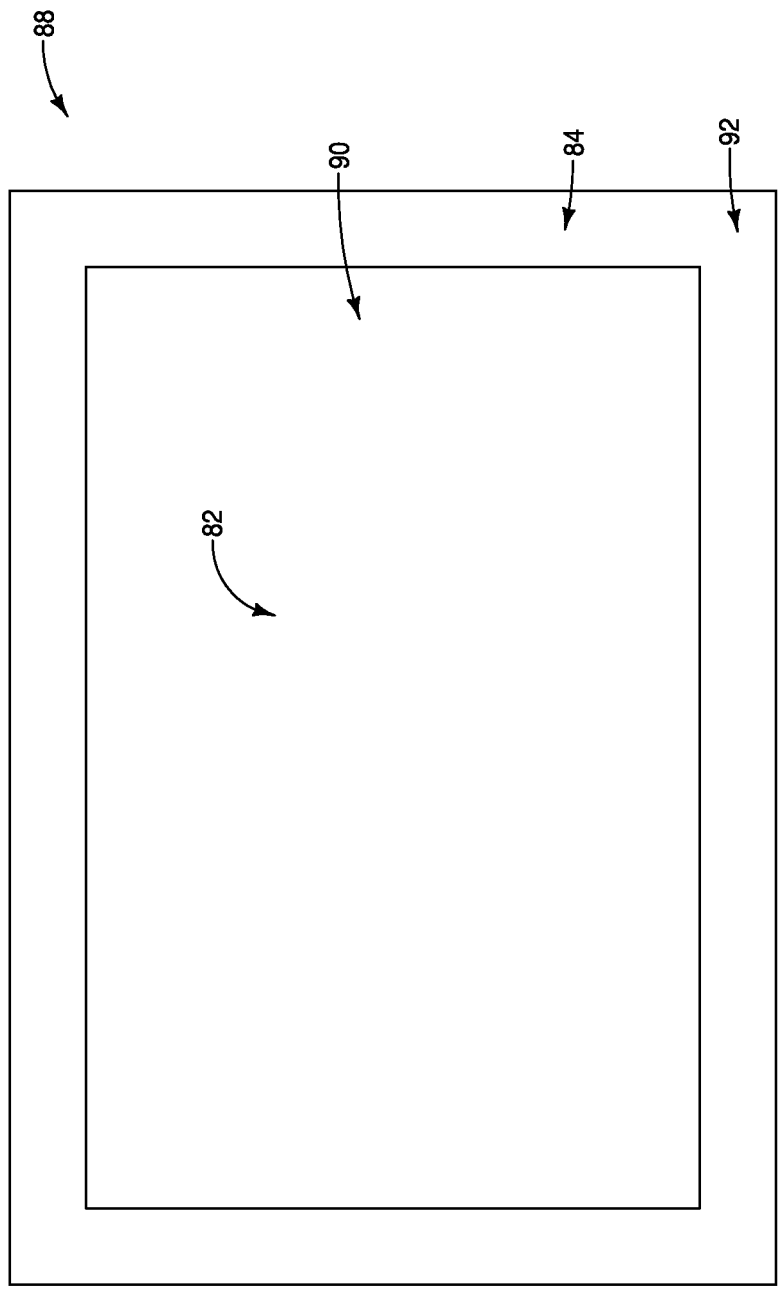
FIG. 25 is a diagrammatic top-down view of a singulated die cut from the wafer of FIG. 24.

Each finished die is part of a die configuration. FIG. 25 shows a die configuration 88, and shows that such die configuration has a primary region 90 comprising the die location 82, and has an edge region 92 surrounding the primary region 90. The edge region 92 includes a portion of the intervening region 84 (FIG. 24). The first channel-material pillars 24b (e.g., FIG. 20) covered by multi-material etch-stop structures 42 (e.g., FIG. 20) may be present in the primary regions 90 and/or in the edge regions 92.

Figure 26:
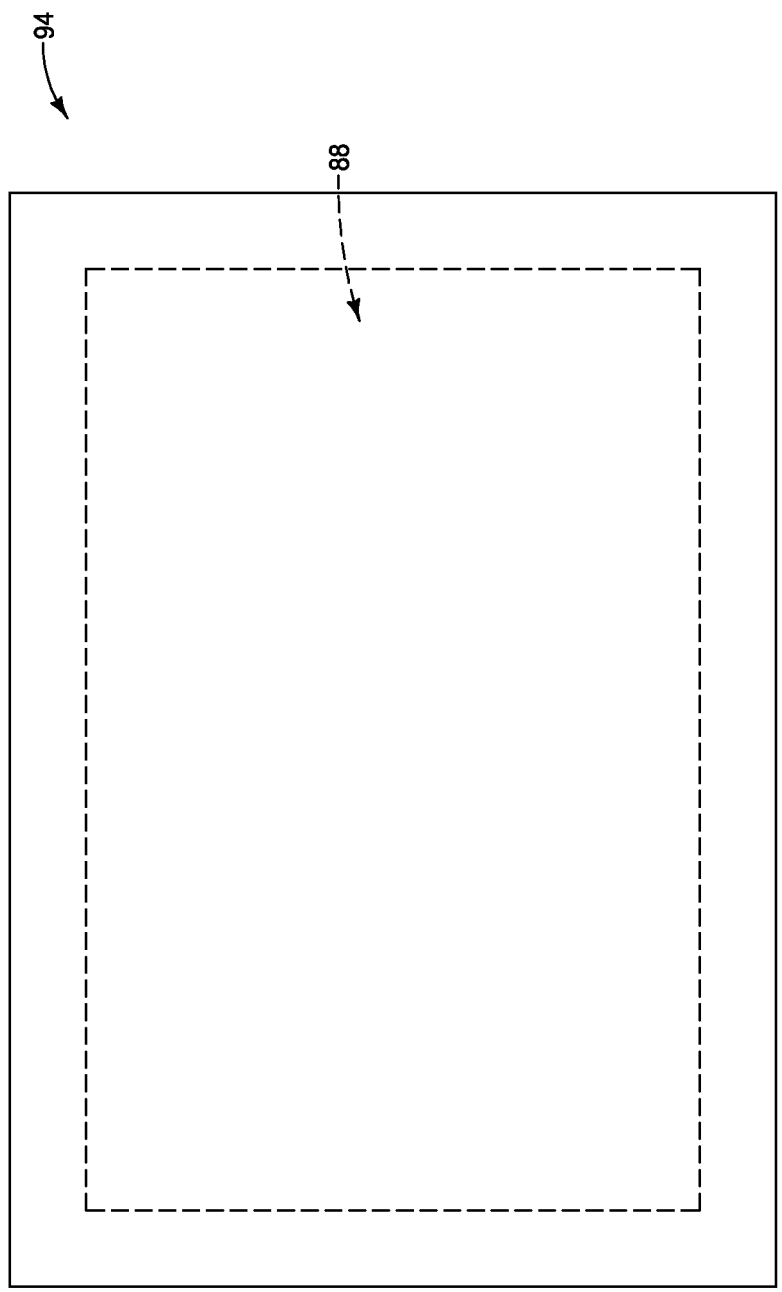
FIG. 26 is a diagrammatic top-down view of the singulated die of FIG. 25 incorporated into a package.

The die configuration 88 of FIG. 25 may be incorporated into a semiconductor package 94 as shown in FIG. 26. The package 94 may comprise encapsulation material over the die configuration 88, and accordingly the die configuration is shown in dashed-line (i.e., phantom) view in order to indicate that the die configuration may be under other materials. The package 94 may include pins, pads, wires, etc. (not shown) for electrically coupling circuitry of the die configuration 88 with circuitry external of the package 94. Although the semiconductor package 94 is shown comprising only a single die, in other embodiments individual semiconductor packages may comprise multiple dies. The first channel-material pillars 24b (e.g., FIG. 20) covered by multi-material etch-stop structures 42 (e.g., FIG. 20) may be present within the packaged die configuration 88.

The assemblies and structures discussed above may be utilized within integrated circuits (with the term "integrated circuit" meaning an electronic circuit supported by a semiconductor substrate); and may be incorporated into electronic systems. Such electronic systems may be used in, for example, memory modules, device drivers, power modules, communication modems, processor modules, and application-specific modules, and may include multilayer, multi-chip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on", "adjacent" or "against" another structure, it can be directly on the other structure or intervening structures may also be present. In contrast, when a structure is referred to as being "directly on", "directly adjacent" or "directly against" another structure, there are no intervening structures present.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include a method of forming stacked decks of memory cells. A first deck is formed to have first memory cells arranged in first tiers disposed one atop another, and to have a first channel-material pillar extending through the first tiers. An inter-deck structure is formed over the first deck. The inter-deck structure includes an insulative expanse, and a region extending through the insulative expanse and directly over the first channel-material pillar. The region includes an etch-stop structure. A second deck is formed over the inter-deck structure. The second deck has second memory cells arranged in second tiers disposed one atop another. An opening is formed to extends through the second tiers and to the etch-stop structure. The opening is extended through the etch-stop structure with conditions which selectively remove the etch-stop structure relative to the insulative expanse. A second channel-material pillar is formed within the opening and is coupled to the first channel-material pillar.

Some embodiments include a method of forming stacked decks of memory cells. A first deck is formed over a source conductor structure. The first deck has first memory cells arranged in first tiers disposed one atop another, and has a first channel-material pillar extending through the first tiers and coupling with the source conductor structure. A spacing structure is formed over the first deck. The spacing structure comprises an insulative expanse, and comprises a region extending through the insulative expanse to a conductive coupler associated with the first channel-material pillar. The region comprises an etch-stop structure. A second deck is formed over the spacing structure. The second deck has second memory cells arranged in second tiers disposed one atop another. An opening is formed to extend through the second tiers and to the etch-stop structure. The opening is extended through the etch-stop structure to the conductive coupler with conditions which selectively remove the etch-stop structure relative to the insulative expanse and relative to the conductive coupler. A second channel-material pillar is formed within the opening and is coupled to the first channel-material pillar through the conductive coupler.

Some embodiments include an integrated assembly which includes a first deck having first memory cells arranged in first tiers disposed one atop another, and which includes first channel-material pillars extending through the first tiers. An inter-deck structure is over the first deck. The inter-deck structure comprises an insulative expanse. A second deck is over the inter-deck structure. The second deck has second memory cells arranged in second tiers disposed one atop another. Second channel-material pillars are coupled to some of the first channel-material pillars through conductive interconnects passing through the inter-deck structure. A first channel-material pillar is not coupled with any of the second channel-material pillars, and instead is covered by a multi-material structure which extends into the inter-deck structure.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. An integrated assembly, comprising:
   a first deck having first memory cells arranged in first tiers disposed one atop another, and having first channel-material pillars extending through the first tiers;
   an inter-deck structure over the first deck; the inter-deck structure comprising an insulative expanse;
   a second deck over the inter-deck structure; the second deck having second memory cells arranged in second tiers disposed one atop another;
   second channel-material pillars coupled to some of the first channel-material pillars through conductive interconnects passing through the inter-deck structure; and
   a first channel-material pillar not being coupled with any of the second channel-material pillars, and instead being covered by a multi-material structure which extends into the inter-deck structure.

2. The integrated assembly of claim 1 wherein said first channel-material pillar which is not coupled with any of the second channel-material pillars is one of a plurality of the first channel-material pillars which are not coupled with any of the second channel-material pillars.

3. The integrated assembly of claim 1 comprising
   conductive couplers over the first channel-material pillars; one of the conductive couplers being over the first channel-material pillar which is not coupled with any of the second channel-material pillars; and wherein the multi-material structure is over and directly against said one of the conductive couplers.

4. The integrated assembly of claim 3 wherein the conductive couplers comprise conductively-doped semiconductor material.

5. The integrated assembly of claim 4 wherein the multi-material structure includes tungsten over the conductively-doped semiconductor material, and includes a liner between the tungsten and the conductively-doped semiconductor material; wherein the liner comprises nitrogen and one or both of titanium and tungsten.

6. The integrated assembly of claim 1 wherein said multi-material structure includes an oxide over a metal-containing material which is not an oxide.

7. The integrated assembly of claim 6 wherein said oxide is a metal oxide.

8. The integrated assembly of claim 7 wherein the metal oxide comprises one or more of magnesium oxide, aluminum oxide, hafnium oxide and zirconium oxide.

9. The integrated assembly of claim 6 wherein the metal-containing material which is not an oxide comprises one or more of tungsten, tungsten nitride, titanium and titanium nitride.

10. The integrated assembly of claim 1 wherein said multi-material structure includes aluminum oxide over tungsten.

11. The integrated assembly of claim 1 wherein said multi-material structure includes, in ascending order from the first channel-material pillar which is not coupled with any of the second channel-material pillars; a liner comprising nitrogen and one or both of titanium and tungsten; a mid-level material comprising one or both of titanium and tungsten; and an upper-level material comprising aluminum oxide.

12. The integrated assembly of claim 11 wherein said multi-material structure has a thickness within a range of from about 10 nm to about 300 nm; the liner has a thickness within a range of from about 10 Å to about 5 nm; the mid-level material has a thickness within a first range of from about 5 nm to about 150 nm; and the upper-level material has a thickness within a second range of from about 5 nm to about 150 nm.

* * * * *